United States Patent
Nagao et al.

(10) Patent No.: US 11,142,687 B2
(45) Date of Patent: Oct. 12, 2021

(54) COMPOSITION, A PROCESS OF PRODUCING THE SAME, AND USE OF THE SAME

(71) Applicant: NATIONAL INSTITUTE FOR MATERIALS SCIENCE, Tsukuba (JP)

(72) Inventors: Tadaaki Nagao, Tsukuba (JP); Karuna Kar Nanda, Tsukuba (JP)

(73) Assignee: NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 243 days.

(21) Appl. No.: 16/486,017

(22) PCT Filed: Mar. 1, 2018

(86) PCT No.: PCT/JP2018/007737
§ 371 (c)(1),
(2) Date: Aug. 14, 2019

(87) PCT Pub. No.: WO2018/163955
PCT Pub. Date: Sep. 13, 2018

(65) Prior Publication Data
US 2020/0048548 A1 Feb. 13, 2020

(30) Foreign Application Priority Data

Mar. 9, 2017 (JP) .............................. JP2017-044861
Nov. 6, 2017 (JP) .............................. JP2017-213413

(51) Int. Cl.
*C09K 11/65* (2006.01)
*C09K 11/02* (2006.01)
(Continued)

(52) U.S. Cl.
CPC ................ *C09K 11/65* (2013.01); *A01G 7/00* (2013.01); *C01B 32/182* (2017.08);
(Continued)

(58) Field of Classification Search
CPC ......... C09K 11/65; B82Y 30/00; B82Y 40/00; C01B 32/182; C01B 32/184; C01B 32/15;
(Continued)

(56) References Cited

U.S. PATENT DOCUMENTS

2013/0181165 A1  7/2013  Tetsuka et al.
2015/0361334 A1  12/2015  Kwon et al.
(Continued)

FOREIGN PATENT DOCUMENTS

JP  2005-170020 A  6/2005
JP  2015-174945 A  10/2015
(Continued)

OTHER PUBLICATIONS

PCT/ISA/210, "International Search Report for International Application No. PCT/JP2018/007737," dated Apr. 3, 2018.
(Continued)

*Primary Examiner* — C Melissa Koslow
(74) *Attorney, Agent, or Firm* — Manabu Kanesaka

(57) ABSTRACT

The present invention has for its object to provide a composition in which a photoluminescent carbon nanoparticle having no dependency of an emission wavelength on an excitation wavelength and being enhanced in terms of quantum efficiency is dispersed, a process of producing the same, and an application of the same. The composition of the invention has a photoluminescent carbon nanoparticle dispersed in a water-soluble solvent. The photoluminescent carbon nanoparticle contains a carbon atom, an oxygen atom, a nitrogen atom, and a hydrogen atom if required. As shown in FIG. 6, the photoluminescent carbon nanoparticle has an intensity of a C—N bond and/or C—O bond-derived peak (285.98 eV) larger than that of a C—C bond and/or C—H bond-derived peak (284.95 eV) in terms of X-ray
(Continued)

photoelectron spectroscopic spectra, and a Raman spectrum having a peak based on a G-band and a D-band.

20 Claims, 11 Drawing Sheets

(51) Int. Cl.
*B82Y 30/00* (2011.01)
*B82Y 40/00* (2011.01)
*C01B 32/182* (2017.01)
*A01G 7/00* (2006.01)
*H01L 33/50* (2010.01)
*H01L 31/055* (2014.01)
*B82Y 20/00* (2011.01)
*C08L 101/14* (2006.01)

(52) U.S. Cl.
CPC ............ *C08L 101/14* (2013.01); *C09K 11/02* (2013.01); *H01L 31/055* (2013.01); *H01L 33/50* (2013.01); *B82Y 20/00* (2013.01); *B82Y 30/00* (2013.01); *B82Y 40/00* (2013.01)

(58) Field of Classification Search
CPC ............ C01B 2204/20; H01L 31/0232; H01L 33/502; C08K 3/042; H02S 40/20; A01G 7/00

See application file for complete search history.

(56) References Cited

U.S. PATENT DOCUMENTS

| 2016/0060121 A1 | 3/2016 | Lee et al. |
| 2016/0060122 A1 | 3/2016 | Tour et al. |
| 2018/0022994 A1 | 1/2018 | Isaji et al. |

FOREIGN PATENT DOCUMENTS

| JP | 2016-525997 A | 9/2016 |
| JP | 2017-002155 A | 1/2017 |
| WO | 2012/086260 A1 | 6/2012 |
| WO | 2014/084797 A1 | 6/2014 |
| WO | 2016/129441 A1 | 8/2016 |

OTHER PUBLICATIONS

Peng, J. et al., "Graphene Quantum Dots Derived from Carbon Fibers," Nano Letters, 2012, p. 844-849, vol. 12, ACS Publications.

Qu, D. et al., "Formation mechanism and optimization of highly luminescent N-doped graphene quantum dots," Scientific Reports, 2014, p. 1-9, 4 : 5294.

Ding, H. et al., "Highly Efficient Red-Emitting Carbon Dots with Gram-Scale Yield for Bioimaging," Langmuir, 2017, p. 12635-12642, vol. 33, ACS Publications.

Du, F. et al., "Nitrogen-doped carbon dots as multifunctional fluorescent probes," Journal of Nanoparticle Research, 2014, p. 1-10, 16 : 2720, Springer.

FIG.1

Step S110: An organic material selected from the group consisting of citric acid, benzoic acid, glucose, fructose and sucrose and at least one of an amine, an inorganic acid and acetic acid are dissolved in a water-soluble solvent, and the resulting solution is heated.

Step S120: An alcohol is added to, and stirred with, the solution obtained in Step S110.

Step S130: A supernatant of the solution obtained in Step S120 is extracted.

FIG.2

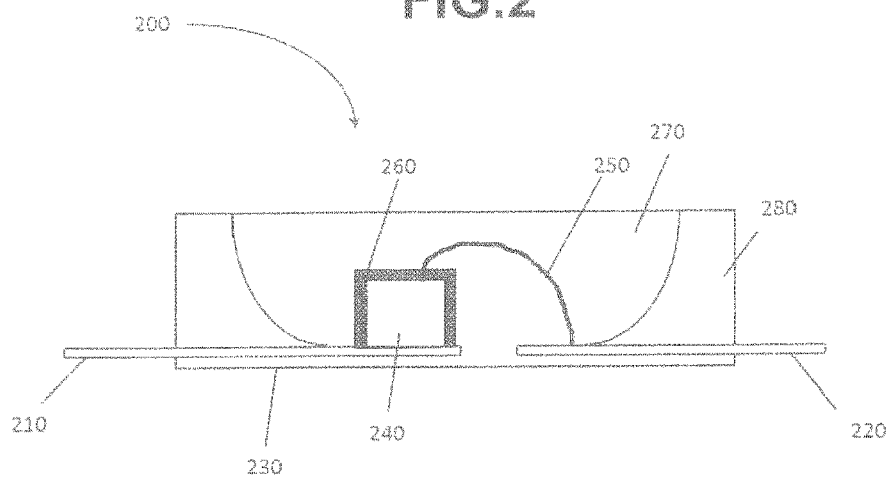

FIG.3

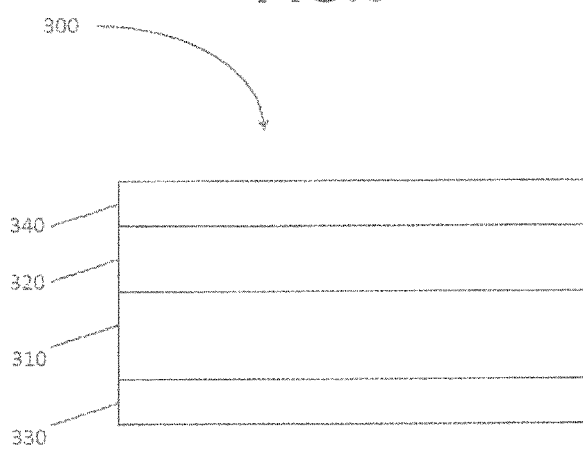

COMPOSITION, A PROCESS OF PRODUCING THE SAME, AND USE OF THE SAME

RELATED APPLICATIONS

The present application is National Phase of International Application No. PCT/JP2018/007737 filed Mar. 1, 2018, and claims priority from Japanese Applications No. 2017-044861, filed Mar. 9, 2017, and No. 2017-213413, filed Nov. 6, 2017, the disclosure of which is hereby incorporated by reference herein in its entirety.

FIELD OF THE INVENTION

The present invention relates to a composition using a photoluminescent carbon nanoparticle, a process of producing the same, and use of the same.

DESCRIPTION OF THE BACKGROUND ART

In recent years, photoluminescent graphene quantum dots have been reported (see Non-Patent Publications 1, 2 and 3). Non-Patent Publication 1 has reported that carbon nanofibers are cut and pulverized and then treated by acids to form graphene quantum dots capable of emitting blue, green and yellow lights depending on treatment temperatures. Non-Patent Publication 2 has reported that photoluminescent nitrogen-doped graphene quantum dots are produced by hydrothermal synthesis using citric acid and ethylenediamine. Non-Patent Publication 3 has reported that red-emitting carbon dots are obtained by way of hydrothermal synthesis of citric acid and ethylenediamine in formamide.

With the thus obtained composition, however, the wavelength of incident light changes ending up with a change in the emitted wavelength. As sunlight or white light having a broad wavelength distribution is used as the incident light, the composition will emit light having a broad band in wavelength. In other words, such a composition is still unsuitable for applications where light having the desired wavelength is selectively emitted out.

The composition obtained this way has a quantum efficiency of 90% or higher when the photoluminescent phosphor is dispersed in a solution; however, as it is coated and dried for use, it often gives rise to agglutination of the phosphor leading to a considerable lowering of fluorescence intensity or emission intensity due to concentration quenching. Light-emitting nanomaterials with the phosphor remaining dispersed in a solution in a colloidal or other state have only limited applications, resulting in the need for a method of dispersing and solidifying the composition in the concentration best-suited to obtain fluorescence intensity or emission intensity.

PRIOR ARTS

Non-Patent Publications

Non-Patent Publication 1: Juan Peng et al., Nano Lett., 2012, 12, 844-849

Non-Patent Publication 2: Dan Qu et al., SCIENTIFIC REPORTS 4, 5294, 2014

Non-Patent Publication 3: Hui Ding et al., Langmuir 2017, 33, 12635-12642

SUMMARY OF THE INVENTION

Objects of the Invention

The present invention has for its object to provide a composition having a photoluminescent carbon nanoparticle dispersed therein, which has an emission wavelength having no excitation wavelength dependency and is improved in terms of quantum efficiency, a process of producing the same, and use of the same.

Embodiments of the Invention

In a composition of the invention having a photoluminescent carbon nanoparticle dispersed in a water-soluble solvent, the photoluminescent carbon nanoparticle contains a carbon atom, an oxygen atom, a nitrogen atom, and a hydrogen atom if required, and has an intensity of a C—N bond and/or C—O bond-derived peak (285.98 eV) larger than that of a C—C bond and/or C—H bond-derived peak (284.95 eV) in terms of X-ray photoelectron spectroscopic spectra and exhibits a Raman spectrum having a peak based on a G-band and a D-band, whereby the aforesaid object is achievable.

The photoluminescent carbon nanoparticle may further have an N—H bond, a C=C bond, and a C≡C bond.

In the photoluminescent carbon nanoparticle, the atomic ratio (N/C) of the nitrogen atom relative to the carbon atom may be no less than 0.27 to no greater than 0.37, and the atomic ratio (O/C) of the oxygen atom relative to the carbon atom may be no less than 0.35 to no greater than 0.45.

The carbon atom may contain a carbon atom derived from a graphene structure, a carbon atom derived from a defective graphene structure and/or a carbon atom derived from a diamond structure.

The photoluminescent carbon nanoparticle may have a diameter in a range of no less than 1 nm to no greater than 10 nm.

The photoluminescent carbon nanoparticle may have a concentration in a range of no less than $1 \times 10^{-4}$ g/L to no greater than 300 g/L.

The photoluminescent carbon nanoparticle may have a concentration in a range of no less than $1 \times 10^{-4}$ g/L to no greater than 100 g/L.

The water-soluble solvent may be water and/or a water-soluble organic solvent.

The water-soluble solvent may further contain a water-soluble polymer.

The water-soluble polymer may be selected from the group consisting of polyvinyl alcohol, sodium polyacrylate, polyacrylamide, polyethylene imine, polyethylene oxide, polyvinyl pyrrolidone, and carboxylvinyl polymer.

The composition of the invention may have an emission peak in a wavelength range of no less than 400 nm to no greater than 700 nm by excitation source irradiation.

The composition of the invention may have an emission peak in a wavelength range of no less than 410 nm to no greater than 460 nm by excitation source irradiation.

The process of producing the composition having the photoluminescent carbon nanoparticle dispersed in a water-soluble solvent includes a step of hydrothermal synthesis of a solution in which an organic material selected from the group consisting of citric acid, benzoic acid, glucose, fructose and sucrose, an amine, and at least one of an inorganic acid and acetic acid are dissolved in a water-soluble solvent, a step of adding an alcohol to a solution obtained by the hydrothermal step and stirring the solution, and a step of extracting a supernatant from a solution obtained by the adding/stirring step, whereby the aforesaid object is achievable.

The inorganic acid may be selected from the group consisting of hydrochloric acid, nitric acid, phosphoric acid, sulfuric acid, boric acid, and fluoric acid.

The hydrothermal synthesis step may be carried out by heating the solution in a temperature range of no lower than 100° C. to no higher than 280° C. for a time period of no shorter than 0.5 hour to no longer than 10 hours.

The hydrothermal synthesis step may be carried out by heating the solution in a temperature range of no lower than 130° C. to no higher than 250° C.

The organic material, the amine and the acid may be dissolved in the water-soluble solvent such that per 100 parts by weight of the water-soluble solvent, the organic material satisfies a range of no less than 0.1 part by weight to no greater than 30 parts by weight; the amine satisfies a range of more than 0 part by weight to no greater than 25 parts by weight; and at least one selected from the inorganic acid and acetic acid satisfies a range of more than 0 part by weight to no greater than 5 parts by weight.

At least one selected from the inorganic acid and acetic acid may satisfy a range of no less than 0.1 part by weight to no greater than 3 parts by weight.

At least one selected from the inorganic acid and acetic acid may satisfy a range of no less than 1 part by weight to no greater than 1.5 parts by weight.

The alcohol may be selected from the group consisting of methanol, ethanol, 1-propanol, 2-propanol, 1-butanol, 2-butanol, 2-methylbutanol, and t-butanol.

In the adding/stirring step, the alcohol may be added to the solution in a range of no less than 10 v/v % to no greater than 1000 v/v %.

In the adding/stirring step, the alcohol may be added to the solution in a range of no less than 100 v/v % to no greater than 1000 v/v %.

The amine may be selected from the group consisting of methylamine, dimethylamine, trimethylamine, diethylamine, triethylamine and ethylenediamine.

In the resin-molded package (resin-molded member or material) of the invention having a photoluminescent carbon nanoparticle dispersed in a resin, the photoluminescent carbon nanoparticle contains a carbon atom, an oxygen atom, a nitrogen atom, and a hydrogen atom if required, and has an intensity of a C—N bond and/or C—O bond-derived peak (285.98 eV) larger than that of a C—C bond and/or C—H bond-derived peak (284.95 eV) as measured by X-ray photoelectron spectroscopic spectra and has a Raman spectrum having a peak based on a G-band and a D-band, and the resin is a water-soluble polymer through which light having wavelengths from the ultraviolet region to the visible region transmits whereby the aforesaid object is achievable.

The content of the photoluminescent carbon nanoparticle in the water-soluble polymer may be in a range of no less than $1 \times 10^{-4}$ wt % to no greater than 10 wt %.

The content of the photoluminescent carbon nanoparticle in the water-soluble polymer may be in a range of no less than $1 \times 10^{-4}$ wt % to no greater than 2 wt %.

The water-soluble polymer may be selected from the group consisting of polyvinyl alcohol, sodium polyacrylate, polyacrylamide, polyethylene-imine, polyethylene oxide, polyvinyl pyrrolidone, and carboxylvinyl polymer.

The ink material containing the photoluminescent phosphor according to the invention comprises the aforesaid composition thereby achieving the aforesaid object.

The light-emitting device according to the invention includes at least an excitation source and a phosphor wherein the phosphor comprises the aforesaid resin-molded package thereby achieving the aforesaid object.

The excitation source may emit a light having a peak wavelength in a range of no less than 200 nm to no greater than 500 nm.

The phosphor may further comprise a green phosphor, and a red phosphor.

The green phosphor may be selected from the group consisting of a $Ga_2O_3$ nanoparticle phosphor, a $SrGa_2S_4$:$Eu^{2+}$ phosphor, a β-Sialon:$Eu^{2+}$ phosphor, a $SrSi_2O_2N_2$:$Eu^{2+}$ phosphor, a $Ba_3Si_6O_{12}N_2$:$Eu^{2+}$ phosphor, a $BaMgAl_{10}O_{17}$:$Eu^{2+}$ phosphor, and a $SrAl_2O_4$:$Eu^{2+}$ phosphor.

The red phosphor may be selected from the group consisting of a nitrogen-doped $Ga_2O_3$ nanoparticle phosphor, a (Sr, Ca)S:$Eu^{2+}$ phosphor, a (Ca, Sr)$_2$Si$_5$N$_8$:$Eu^{2+}$ phosphor, a CaAlSiN$_3$:$Eu^{2+}$ phosphor, a $La_2O_2S$:$Eu^{3+}$ phosphor, a LiEuW$_2$O$_8$ phosphor, and a $Ba_3MgSi_2O_8$:$Eu^{2+}$, $Mn^{2+}$ phosphor.

The solar battery module according to the invention includes at least a solar battery cell and a transparent sealing film positioned on a light-receiving surface of the solar battery cell, wherein the transparent sealing film is formed of the aforesaid resin-molded package thereby achieving the aforesaid object.

The plant containing the photoluminescent phosphor according to the invention contains the aforesaid composition thereby achieving the aforesaid object.

The ornamental plant system according to the invention comprises a plant containing a photoluminescent phosphor and an excitation source configured to excite the phosphor, wherein the aforesaid plant is used as the plant thereby achieving the aforesaid object.

A method of growing the aforesaid plant according to the invention includes a step of cultivating a plant in the aforesaid composition thereby achieving the aforesaid object.

Advantages of the Invention

In the composition according to the invention, the photoluminescent carbon nanoparticle contains a carbon atom, an oxygen atom, a nitrogen atom, and a hydrogen atom if required, and is controlled such that it has an intensity of a C—N bond and/or C—O bond-derived peak (285.98 eV) larger than that of a C—C bond and/or C—H bond-derived peak (284.95 eV) in terms of X-ray photoelectron spectroscopic spectra. Further, the Raman spectrum of the photoluminescent carbon nanoparticle has a peak based on a G-band and a D-band. Satisfaction of such conditions makes it possible for the photoluminescent carbon nanoparticle to emit a blue to red light having enhanced quantum efficiency without depending on excitation wavelengths.

Such a composition is preferable for ink materials and growth of plants. If a plant is grown with the use of the composition of the invention, a plant containing the composition of the invention can then be obtained for use in ornamental applications or enhancement of photosynthesis taking advantage of a blue light. The composition of the invention may also be used as a label or marker for observations by a fluorescence microscope or, alternatively, applied to UV cutting materials or cosmetics or ointments having a function of preventing sunburn. Further, the composition of the invention may be applied to glazes because of absorbing visible light to ultraviolet rays to emit a blue to red light.

In addition, the resin-molded package in which the photoluminescent carbon nanoparticle is resin-fixed by a water-soluble polymer may function as a phosphor that, as is the case with the single photoluminescent carbon nanoparticle, is capable of emitting a blue to red light having enhanced quantum efficiency without depending on excitation wavelengths, with good enough durability. If such a resin-molded package is used in combination with an excitation source, it can then function as a light emitting device or a coloration material. Such a resin-molded package also provides a sealing film for solar battery cells because of being capable of absorbing ultraviolet light efficiently and converting it into a blue light. If the resin-molded package is applied to the roof of a vinyl house or the like, it is then possible to reduce ultraviolet light from sunlight and increase light having a blue or red component effective for growth of plants.

According to the composition production process of the invention making use of a water-soluble solvent solution containing a given organic material, an amine, and at least one selected from an inorganic acid and acetic acid, it is possible to provide a composition containing a photoluminescent carbon nanoparticle that is capable of emitting a blue to red light and enhanced in terms of quantum efficiency without depending on excitation wavelengths. The addition of an alcohol in particular enables impurities to be efficiently removed, providing a high-quality composition with high purity.

BRIEF DESCRIPTION OF THE DRAWINGS

FIG. 1 is a flowchart for the process steps of producing the composition of the invention.

FIG. 2 is a schematic view of a light-emitting device using the resin-molded package of the invention.

FIG. 3 is a schematic view of a solar battery module using the resin-molded package of the invention.

EMBODIMENTS FOR CARRYING OUT THE INVENTION

Figure 4:
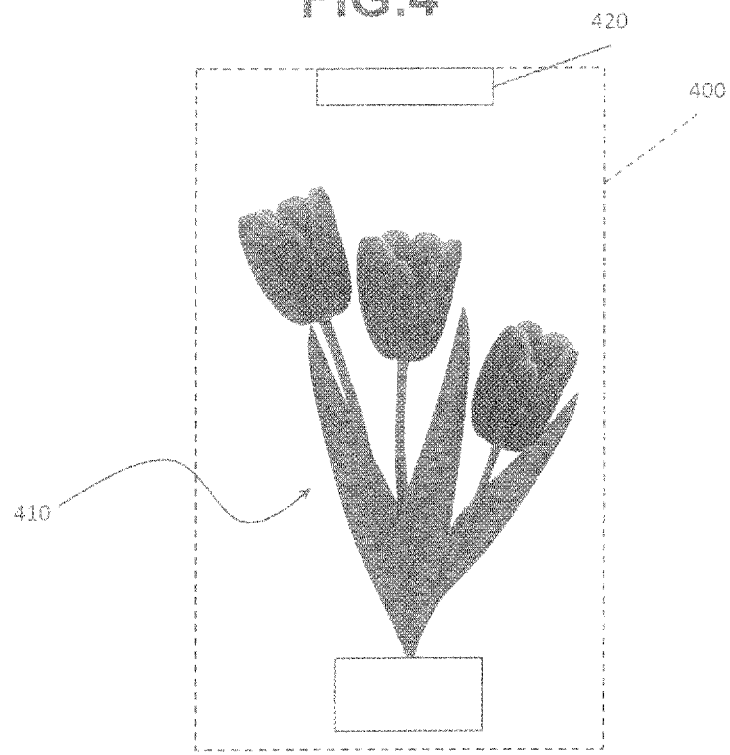
FIG. 4 shows an ornamental plant system provided with a plant containing the photoluminescent carbon nanoparticle according to the invention.

Some embodiments of the invention will now be explained with reference to the accompanying drawings. Note here that like elements are provided with like reference numerals for omission of their explanation.

Embodiment 1

Referring to Embodiment 1, the compositions and production process according to the invention will be explained in details.

The composition of the invention is a liquid composition in which the photoluminescent carbon nanoparticle (or fluorescent substance) is dispersed in a water-soluble solvent. Note here that the photoluminescent carbon nanoparticle contains a carbon atom, an oxygen atom, a nitrogen atom, and a hydrogen atom if required, and is controlled such that it has an intensity of a C—N bond and/or C—O bond-derived peak (285.98 eV) larger than that of a C—C bond and/or C—H bond-derived peak (284.95 eV) in terms of X-ray photoelectron spectroscopic spectra. In the composition of the invention, the photoluminescent carbon nanoparticle exhibits further a Raman spectrum having a peak based on a G-band and a D-band.

Referring here to the graphene quantum dots of Non-Patent Publications 1 and 2, Non-Patent Publication 1 shows in FIG. 2(c) the XPS spectra of the graphene quantum dots obtained from carbon nanofibers, but the C—O bond-derived peak intensity was less than the C—C bond-derived peak intensity, unlike the invention disclosed herein. Likewise, Non-Patent Publication 2 shows in FIG. 6(D) the XPS spectra of the graphene quantum dots hydrothermally synthesized using ethylenediamine, but the C—N bond and/or C—O bond-derived peak intensity was less than the C—C bond and/or C—H bond-derived peak intensity, unlike the invention disclosed herein. With the C—N bond and/or C—O bond as well as the C—C bond and/or C—H bond in the photoluminescent carbon nanoparticle in mind, the inventors have found that if these bonds satisfy a given binding state and contain a carbon atom arising from a crystal state difference, the photoluminescent carbon nanoparticle is then capable of emitting a blue to red light enhanced in terms of emission intensity and quantum efficiency without depending on excitation wavelengths.

By preference, the photoluminescent carbon nanoparticle further has N—H, C=O and C—C bonds. By having all such given bonds, the photoluminescent carbon nanoparticle is capable of emitting a blue to red light enhanced in terms of quantum efficiency without depending on excitation wavelengths. Note here that these bonds are identified by infrared absorption spectra or the like, and that the photoluminescent carbon nanoparticle may further have a C=N bond.

The photoluminescent carbon nanoparticle is preferably controlled such that the atomic ratio (N/C) of the nitrogen atom relative to the carbon atom is no less than 0.27 to no greater than 0.37 and the atomic ratio (O/C) of the oxygen atom relative to the carbon atom is no less than 0.35 to no greater than 0.45 whereby a blue light enhanced in terms of quantum efficiency in particular is achievable without depending on excitation wavelengths. Note here that the atomic ratio may be figured out of peak intensities measured as by X-ray photoelectron spectroscopy (XPS).

Preferably in the photoluminescent carbon nanoparticle, the carbon atom contains a carbon atom derived from a graphene structure, a carbon atom derived from a defective graphene structure, and/or a carbon atom derived from a diamond structure. By having a carbon atom arising from an inner atom sequence difference, the photoluminescent carbon nanoparticle is thus capable of emitting a blue light enhanced in terms of quantum efficiency without depending on excitation wavelengths. Note here that the carbon atom derived from the graphene structure stands for the one having a bond due to the sp2 hybrid orbital; the carbon atom derived from the diamond structure stands for the one having a bond due to the sp3 hybrid orbital; and the presence of a carbon atom having a bond due to the sp2 or sp3 hybrid orbital may be identified as by X-ray absorption fine structure analysis (XAFS).

It is preferable that the photoluminescent carbon nanoparticle has an average diameter (particle size) in a range of no less than 1 nm to no greater than 10 nm. Such a particle size makes sure enhanced quantum efficiency. Note here that the average particle size may be measured by dynamic light scattering particle size distribution measurement, but it is simpler and more preferable to determine it from the average of 100 particles as observed under a transmission electron microscope (TEM).

The water-soluble solvent in the composition of the invention is water and/or a water-soluble organic solvent in which the photoluminescent carbon nanoparticle could be well dissolved. More specifically, the water-soluble solvent includes an alcohol such as methanol, ethanol, 1-propanol, 2-propanol, 1-butanol, 2-butanol, 2-methylbutanol and t-butanol, an amide such as dimethylformamide, diethylacetamide and formamide, and a ketone such as acetone.

In the composition of the invention, the water-soluble solvent may further contain a water-soluble polymer. More specifically, the water-soluble polymer is selected from the group consisting of polyvinyl alcohol, sodium polyacrylate, polyacrylamide, polyethylene-imine, polyethylene oxide, polyvinyl pyrrolidone, and carboxyvinyl polymer, in which the photoluminescent carbon nanoparticle could be well dispersed because of high affinity with the water-soluble solvent.

Preferably, the concentration of the photoluminescent carbon nanoparticle in the composition of the invention satisfies the range of no less than $1\times10^{-4}$ g/L to no greater than 300 g/L. A concentration of less than $1\times10^{-4}$ g/L often leads to no sufficient emission intensity due to too few photoluminescent carbon nanoparticles, and a concentration of greater than 300 g/L causes the emission intensity to go down by way of concentration quenching caused by too much photoluminescent carbon nanoparticle.

More preferably, the concentration of the photoluminescent carbon nanoparticle in the composition of the invention satisfies the range of no less than $1\times10^{-4}$ g/L to no greater than 100 g/L, in which range higher emission intensities could be obtained. Even more preferably, the concentration of the photoluminescent carbon nanoparticle in the composition of the invention satisfies the range of no less than $1\times10^{-4}$ g/L to no greater than 1 g/L, in which range higher emission intensities could be obtained even when fewer phosphors are used. Most preferably, there is the range of no less than $3\times10^{-2}$ g/L to no greater than $1\times10^{-1}$ g/L satisfied, ensuring that higher emission intensities and higher quantum efficiencies are obtained even when fewer phosphors are used.

As the photoluminescent carbon nanoparticle dispersed in the water-soluble solvent is excited by excitation source irradiation, it allows the composition of the invention to have an emission peak in a wavelength range of no less than 400 nm to no greater than 700 nm. The composition of the invention emits a blue to red light depending on the kind of the organic material acting as the carbon source or the kind of the water-soluble solvent used for production; so the composition of the invention is advantageously used in applications needing such emission colors.

As the photoluminescent carbon nanoparticle dispersed in the water-soluble solvent is excited by excitation source irradiation, preferably under control of the bonding or binding state, it allows the composition of the invention to have an emission peak in a wavelength range of no less than 410 nm to no greater than 460 nm. The composition of the invention is capable of emitting a blue light enhanced in terms of quantum efficiency in particular without depending on excitation wavelengths.

The excitation source may be any desired source capable of emitting deep ultraviolet rays, ultraviolet rays or visible light having a wavelength range of no less than 200 nm to no greater than 500 nm. The composition of the invention is efficiently excited by ultraviolet light of no less than 220 nm to no greater than 430 nm, preferably ultraviolet light of no less than 240 nm to no greater than 420 nm, more preferably ultraviolet light of no less than 300 nm to no greater than 400 nm, and most preferably ultraviolet light of no less than 350 nm to no greater than 375 nm. For instance, LED light emitting devices capable of emitting ultraviolet (or purple) of 330 to 420 nm are known as an excitation source emitting out light having such wavelengths. Some LED light emitting devices comprise nitride semiconductors such as GaN and InGaN.

Although the composition of the invention is efficiently excited by light in the aforesaid wavelength range, yet it may also be excited by other wavelengths to emit a blue to red light; however, the emission efficiency is not that high but does not depend on excitation wavelengths because there is a blue to red light prima facie emitted. For instance, the composition of the invention may be excited not only by the ultraviolet light component of sunlight or white LED light to emit a blue to red light but also by other light components to emit a blue to red light. In other words, both sunlight and white LED light may also be used as the excitation source.

The process of producing the composition of the invention will now be explained.

FIG. 1 is a flowchart illustrative of the steps for producing the composition of the invention.

Step S110

An organic material selected from the group consisting of citric acid, benzoic acid, glucose, fructose and sucrose, an amine, and at least one selected from an inorganic acid and acetic acid are dissolved in a water-soluble solvent into a solution that is then hydrothermally synthesized.

The organic material could act as a carbon source. According to the invention, the emission wavelength of the resultant composition may also be controlled by the selection of the organic material. For instance, if fructose or glucose is used as the organic material, there is then a composition obtained, which emits a green light having an emission peak wavelength of no less than 500 nm to no greater than 570 nm. If citric acid is used as the organic material, on the other hand, there is then a composition obtained, which emits a blue light having an emission peak wavelength of no less than 410 nm to no greater than 460 nm.

The amine could act as a nitrogen source. Although there is no limitation on the type of the amine, by way of example but not by way of limitation, the amine is selected from the group consisting of methylamine, dimethylamine, trimethylamine, diethylamine, triethylamine and ethylenediamine. These amines would commercially be available and have enhanced reactivity with the aforesaid organic material. At least one selected from an inorganic acid and acetic acid could promote the reaction between the organic material and the amine. Although there is no limitation on the type of the inorganic acid, by way of example but not by way of limitation, the inorganic acid is selected from the group consisting of hydrochloric acid, nitric acid, phosphoric acid, sulfuric acid, boric acid and fluoric acid. These inorganic acids or acetic acid could accelerate the reaction involved, resulting in the production of a photoluminescent carbon nanoparticle in which the aforesaid bonding or binding state is satisfied. It is consequently possible to produce a composition containing a photoluminescent carbon nanoparticle capable of emitting a blue to red light enhanced in terms of quantum efficiency and having no dependency on excitation wavelengths.

The water-soluble solvent is water and/or a water-soluble organic solvent in which the photoluminescent carbon nanoparticle could be well dispersed. Specifically, the water-soluble organic solvent includes an alcohol such as methanol, ethanol, 1-propanol, 2-propanol, 1-butanol, 2-butanol, 2-methylbutanol and t-butanol, an amide such as dimethylformamide, diethylacetamide and formamide, and a ketone such as acetone. According to the invention, the emission wavelength of the composition may also be controlled by the selection of the water-soluble solvent. Exemplarily, if the amide represented by formamide is used as the water-soluble solvent even when citric acid is used as the organic material, there is then a composition obtained, which emits a red light having an emission peak wavelength of no less than 600 nm to no greater than 700 nm.

Preferably, at least one selected from an organic material, an amine, an inorganic acid and acetic acid is dissolved in the water-soluble solvent such that, per 100 parts by weight of the water-soluble solvent, the organic material satisfies a range of no less than 0.1 part by weight to no greater than 30 parts by weight, the amine satisfies a range of more than 0 part by weight to no greater than 25 parts by weight, and at least one selected from an inorganic acid and acetic acid satisfies a range of more than 0 part by weight to no greater than 5 parts by weight whereby it is possible to produce a photoluminescent carbon nanoparticle-containing composition that emits a blue to red light enhanced in terms of quantum efficiency and having no dependency on excitation wavelengths.

Preferably, at least one selected from an inorganic acid and acetic acid is dissolved in such a way as to satisfy a range of no less than 0.1 part by weight to no greater than 3 parts by weight. Even with a relatively reduced amount of the acid, it is possible to produce a composition containing a photoluminescent carbon nanoparticle that is enhanced in terms of quantum efficiency and has no dependency on excitation wavelengths. More preferably, at least one selected from an inorganic acid and acetic acid is dissolved in such a way as to satisfy a range of no less than 1 part by weight to no greater than 1.5 parts by weight. For instance, when the acid is hydrochloric acid, the composition of the invention can efficiently be produced even with such a limited amount.

The hydrothermal synthesis is carried out by heating a solution, in which the raw materials are dissolved, in a sealed state at a temperature ranging from no lower than 100° C. to no higher than 280° C. for a time period of no shorter than 0.5 hour to no longer than 10 hours. At higher than 280° C., the hydrothermal reaction may take place, but its efficiency is poor. When the heating time is shorter than 0.5 hour, the reaction often becomes insufficient. For a heating time of longer than 10 hours, the reaction does not often proceed anymore. For the hydrothermal synthesis, it is preferable that the solution with the raw materials dissolved in it is heated at a temperature of no lower than 130° C. to no higher than 250° C. thereby making it possible to produce the composition of the invention enhanced in terms of quantum efficiency.

For the hydrothermal synthesis, the solution having the raw materials dissolved in it may be heated with the use of a furnace, an oven, a hot plate or the like, but it is preferable for uniform heating of the solution to use the furnace or oven.

Step S120

An alcohol is added to and stirred with the solution obtained in Step S110 whereby impurities are separated off, ensuring that a good-quality composition is produced. The impurities are usually a viscous liquid capable of visual observation. The alcohol to be added is selected from the group consisting of methanol, ethanol, 1-propanol, 2-propanol, 1-butanol, 2-butanol, 2-methylbutanol, and t-butanol. With these alcohols, the impurities could efficiently be separated off.

The alcohol is added to the solution obtained in Step S110 in an amount of no less than 10 v/v % to no greater than 1000 v/v %. In an amount of less than 10 v/v %, the impurities are often not sufficiently separated off. An amount of greater than 1000 v/v % is of poor efficiency because it fails to have any considerable effect on the separation of impurities. Preferably, the alcohol is added to the solution obtained in Step S110 in an amount of no less than 100 v/v % to no greater than 1000 v/v %, in which the impurities could efficiently be separated off. More preferably, the alcohol is added to the solution obtained in Step S110 in an amount of no less than 300 v/v % to no greater than 500 v/v %, in which the impurities are more efficiently separated off. The term "v/v %" used herein stands for a volume %.

Step S130

A supernatant is extracted from the solution obtained in Step S120. In Step S120, impurities settle down in the solution; if the supernatant is extracted from the solution, it is then possible to produce a high-purity composition devoid of impurities. The supernatant is easily extracted as by separation.

It is to be noted that when the separation of impurities is less than satisfactory, Steps S120 and S130 may be repeated. If the water-soluble polymer is added subsequently to Step S130, there is then a composition obtained, which contains the water-soluble polymer as the water-soluble solvent.

The thus obtained composition may be used as the starting material of the resin-molded packages, ointments and glazes to be later described, or they may act by themselves as a light-emitting material (ink material, vinyl material or the like) making use of fluorescence. For instance, while the composition of the invention is efficiently excited by ultraviolet rays, yet it is also excited by sunlight or white LED containing ultraviolet rays to emit a blue to red light although the efficiency is not high, providing an ink material for fluorescent pens or secret pens. For instance, when the water-soluble polymer is contained as the water-soluble solvent, the composition of the invention may be used as the vinyl material for vinyl houses or the like.

Alternatively, the composition of the invention may be used for the growth of plants. For instance, if a plant is cultivated in at least the composition of the invention, the photoluminescent carbon nanoparticle is taken from the root of the plant into at least the vessel or sieve tube because the photoluminescent carbon nanoparticle in the composition is of a small enough size. The photoluminescent carbon nanoparticle taken in the plant is capable of converting the ultraviolet light component of sunlight into a blue or red light component; the plant containing the photoluminescent carbon nanoparticle of the invention enhances the blue and red light components of sunlight in itself so that photosynthesis is enhanced and, hence, the growth of the plant is enhanced. In the composition of the invention, the photoluminescent carbon nanoparticle is composed mainly of carbon, oxygen, nitrogen and hydrogen and free of any harmful metals; it is no or little harmful to the plant, and does not give rise to environmental pollution even after disposal either.

Embodiment 2

In Embodiment 2, a resin-molded package using the composition of the invention, its production process, and use of that resin-molded package is explained in details.

In the resin-molded package of the invention, the photoluminescent carbon nanoparticle is dispersed in a resin. Being the same as that explained with reference to Embodiment 1, the photoluminescent carbon nanoparticle will not be explained anymore. The resin is a water-soluble polymer transparent to light having a wavelength from an ultraviolet to visible region. The resin-molded package of the invention is made transparent to light including a wavelength in the ultraviolet region by such a water-soluble polymer so that the photoluminescent carbon nanoparticle dispersed in the resin-molded package is excited to emit a blue to red light. The resin-molded package of the invention, because of containing the aforesaid photoluminescent carbon nanoparticle, could emit a blue to red light enhanced in terms of quantum efficiency without depending on excitation wavelengths. The resin-molded package of the invention is also of good-enough durability without giving rise to a drop of quantum efficiency because the phosphor is so dispersed in the resin that it will not get out in the air.

Preferably, the water-soluble polymer is selected from the group consisting of polyvinyl alcohol, sodium polyacrylate, polyacrylamide, polyethylene-imine, polyethylene oxide, polyvinyl pyrrolidone, and carboxylvinyl polymer. These water-soluble polymers are all transparent to lights in the ultraviolet to visible region. Through appropriate selection of the polymers, it is possible to provide a resin-molded package having flexibility or rigidity. Such polymer selection could be well known to those skilled in the art.

The content of the photoluminescent carbon nanoparticle relative to the water-soluble polymer is in a range of no less than $1 \times 10^{-4}$ wt % to no greater than 10 wt %. As the content of the photoluminescent carbon nanoparticle is below $1 \times 10^{-4}$ wt %, it often results in no sufficient emission intensity. As the content of the photoluminescent carbon nanoparticle is greater than 10 wt %, the influence of concentration quenching could be more noticeable.

More preferably, the content of the photoluminescent carbon nanoparticle relative to the water-soluble polymer is in a range of no less than $1 \times 10^{-4}$ wt % to no greater than 2 wt %, in which there could be a resin-molded package provided with high quantum efficiency and emission intensity. Even more preferably, the content of the photoluminescent carbon nanoparticle relative to the water-soluble polymer is in a range of no less than $1 \times 10^{-2}$ wt % to no greater than 1 wt %, in which there could be a resin-molded package provided with high emission intensity and quantum efficiency, because the photoluminescent carbon nanoparticle remains dispersed in the resin with no agglutination. The most preferable range is no less than $1 \times 10^{-2}$ wt % to below 0.7 wt %.

It is to be noted that while the photoluminescent carbon nanoparticle per se emits a blue to red light, the resin-molded package of the invention may contain, in addition to the photoluminescent carbon nanoparticle, a red phosphor capable of being excited by light having ultraviolet rays to emit a red color, a green phosphor capable of emitting a green color, an yellow phosphor capable of emitting an yellow color, etc. For instance, this allows the resin-molded package of the invention to emit a white light in which blue emitted out of the photoluminescent carbon nanoparticle, red emitted out of the red phosphor and green emitted out of the green phosphor are combined together. Such phosphor combinations may optionally be adopted depending on applications.

By way of example but not by way of limitation, the red phosphor is selected from the group consisting of a nitrogen-doped $Ga_2O_3$ nanoparticle phosphor, a $(Sr, Ca)S:Eu^{2+}$ phosphor, a $(Ca, Sr)_2Si_5N_8:Eu^{2+}$ phosphor, a $CaAlSiN_3:Eu^{2+}$ phosphor, a $La_2O_2S:Eu^{3+}$ phosphor, a $LiEuW_2O_8$ phosphor, and a $Ba_3MgSi_2O_8:Eu^{2+}, Mn^{2+}$ phosphor, and the green phosphor is selected from the group consisting of a $Ga_2O_3$ nanoparticle phosphor, a $SrGa_2S_4:Eu^{2+}$ phosphor, a β-Sialon phosphor:$Eu^{2+}$ phosphor, a $SrSi_2O_2N_2:Eu^{2+}$ phosphor, a $Ba_3Si_6O_{12}N_2:Eu^{2+}$ phosphor, a $BaMgAl_{10}O_{17}:Eu^{2+}$ phosphor, and a $SrAl_2O_4:Eu^{2+}$ phosphor.

It is to be noted that when the resin-molded package further contains, in addition to the photoluminescent carbon nanoparticle, the red, green, yellow and other phosphors, it is preferable from the standpoint of dispersion that they have a diameter in a range of no less than 1 nm to no greater than 10 nm.

The resin-molded package of the invention is produced with the use of the composition explained with reference to Embodiment 1. Referring now to the case where the water-soluble solvent in the composition does not contain the water-soluble polymer, the aforesaid water-soluble polymer is added as the water-soluble solvent. In this case, it is preferable that the content of the photoluminescent carbon nanoparticle relative to the water-soluble polymer is adjusted in such a way as to come within the aforesaid range. In addition to the photoluminescent carbon nanoparticle, the aforesaid red, green and yellow phosphors may be added to the composition if necessary.

Then, the water-soluble polymer-containing composition is applied to a substrate or the like by means of coating, dropping or spin coating or, alternatively, the substrate or the like is immersed or dipped in the composition, whereby a thin film comprising the composition is formed on the substrate. If the formed thin film is dried for removal of water and/or the water-soluble organic solvent, there is then a thin-film resin-molded package obtained. If necessary, these steps may be repeated such that the resin-molded package has any desired thickness.

Alternatively, the water-soluble polymer-containing composition may be filled up in a given vessel, and then dried thereby providing a bulky resin-molded package, or electrospinning or the like may be applied to the water-soluble polymer-containing composition thereby obtaining a fibrous resin-molded package.

Applications of the thus obtained resin-molded package of the invention will now be explained.

In one application, the resin-molded package is used as a light-emitting device. The light-emitting device of the invention comprises at least an excitation source and a phosphor including the aforesaid resin-molded package. According to such configuration, it is possible to provide a light-emitting device having any desired emission color. The excitation source typically includes a light-emitting diode, a laser diode, an organic EL, a semiconductor laser, and a fluorescent lamp, but devices used herein emit a light having a peak in a range of no less than 200 nm to no greater than 500 nm. Preferable among others is a purple light-emitting diode having a peak in a range of no less than 330 nm to no greater than 420 nm, because the resin-molded package of the invention can efficiently be excited. One exemplary light-emitting device is explained with reference to FIG. 2.

FIG. 2 is a schematic view of the light-emitting device making use of the resin-molded package according to the invention.

A light-emitting device 200 of FIG. 2 is provided in the form of a board-mounting type white light-emitting diode lamp. The light-emitting device 200 includes lead wires 210 and 220 that are fixed to a white alumina substrate 230 having a high visible light reflectivity. A purple light-emitting diode element 240 having an emission peak wavelength of 405 nm is mounted on, and electrically connected to, one end of one lead wire 210 by way of a conductive paste or the like. The purple light-emitting diode element 240 is electrically connected to another lead wire 220 by way of a fine gold wire 250. The other ends of the lead wires 210 and 220 are exposed out, functioning as electrodes.

The purple light-emitting diode 240 is covered with a resin-molded package 260 of the invention. Suppose here that the resin-molded package 260 contains as the phosphor just only a photoluminescent carbon nanoparticle capable of emitting a blue light. The alumina substrate 230 is provided with a wall face member 280 formed of a white silicone resin or the like, and the purple light-emitting diode element 240 covered with the resin-molded package 260 is positioned at a central portion thereof. At the central portion of the wall face member 280, the purple light-emitting diode element 240 covered with the resin-molded package 260 is sealed up with a transparent resin 270 such as an epoxy resin.

As an electric current passes through the lead wires 210 and 220 of the light-emitting device 200, it causes the purple light-emitting diode element 240 to emit a light having a peak wavelength of 405 nm. This light enters the resin-molded package 260 of the invention where the photoluminescent carbon nanoparticle within the resin-molded package 260 is excited to emit a blue light. The blue light transmits through the resin 270, and exits out. The light-emitting device 200 functions in this way, emitting out a blue light.

By way of example but not by way of limitation, the resin-molded package 260 is configured in such a way as to cover the purple light-emitting diode element 240. For instance, the resin-molded package 260 may be mounted on a light-emitting surface of the purple light-emitting diode element 240 or the resin 270. Alternatively, the resin-molded package 260 may be used in place of the resin 270 such that the whole is formed of the resin-molded package 260.

So far in the present disclosure, suppose that the resin-molded package 260 contains as the phosphor just only a photoluminescent carbon nanoparticle capable of emitting a blue light. If the red and green phosphors are contained in addition to that photoluminescent carbon nanoparticle, however, the light-emitting device 200 functions in such a way as to emit a white light. Alternatively, even if the resin-molded package 260 is covered up with another resin having red and green phosphors dispersed in it, the light-emitting device 200 then functions in such a way as to emit a white light.

While the board-mounting type white light-emitting diode lamp has been explained with reference to FIG. 2, it is to be understood that the resin-molded package of the invention may also be applied to a bullet-shaped white light-emitting diode lamp. Such modification would be obvious to those skilled in the art.

In one application, the resin-molded package is used as a solar battery module. The solar battery module of the invention comprises a solar battery cell, and a transparent sealing film positioned on a light-receiving surface of the solar battery cell, the transparent sealing film comprising the aforesaid resin-molded package. According to such configuration, an ultraviolet light component is converted at the transparent sealing film into a blue light that is in turn injected into a solar battery element. An amorphous silicon solar battery or the like, because of having high energy conversion efficiency for blue light, contributes more to an improvement in the energy conversion efficiency of the solar battery module.

It is to be understood that as the solar battery cell, use may be made of a solar battery based on crystal silicon, amorphous silicon, microcrystal silicon or thin-film silicon, a hetero-junction/multi-junction type solar battery, a cadmium sulfide/cadmium telluride solar battery, a CIS-based thin-film solar battery, a CIGS-based thin-film solar battery, a CZTS-based thin-film solar battery, a III-V group-based solar battery, a dye-sensitized type solar battery, or a solar battery such as an organic semiconductor solar battery. An exemplary solar battery module is explained with reference to FIG. 3.

FIG. 3 is a schematic view of the solar battery module making use of the resin-molded package according to the invention.

A solar battery module 300 of FIG. 3 comprises a solar battery cell 310, and a transparent sealing film 320 positioned on its light-receiving surface. The transparent sealing film 320 comprises the resin-molded package of the invention, as mentioned above. In FIG. 3, another sealing film or back sheet 330 is provided on a side of the solar battery cell 310 opposite to the transparent sealing film 320, and a surface protection film 340 is provided on the transparent sealing film 320; however, such configuration is no more than an illustrative example. By way of example but not by way of limitation, the sealing film or back sheet 330 is a PET sheet, and the surface protection film 340 is a glass or front sheet.

Incident light such as sunlight enters the solar battery cell 310 of the solar battery module 300 through the surface protection film 340 and transparent sealing film 320. The transparent sealing film 320, because of comprising the resin-molded package of the invention, absorbs ultraviolet light out of the incident light so that the photoluminescent carbon nanoparticle in the resin-molded package is excited by the absorbed ultraviolet light, emitting a blue light. In other words, the solar battery cell 310 receives the incident light whose ultraviolet light component is decreased and whose blue light component is increased, making high the efficiency of conversion of the ultraviolet light component of the incident light into an electrical energy. It is consequently possible to provide a solar battery module improved in terms of energy conversion efficiency.

One application of the resin-molded package is the growth of a plant. The resin-molded package of the invention may be used as a vinyl material for the roof of a vinyl house or the like. As the resin-molded package of the invention is applied to the roof of a vinyl house, it causes ultraviolet light to be so absorbed out of sunlight that the photoluminescent carbon nanoparticle in the resin-molded package is excited by the absorbed ultraviolet, emitting a blue or red light. Other light components of sunlight transmit through the roof so that the plant within the vinyl house can be irradiated with a light in which the ultraviolet light component of sunlight is reduced and blue and red lights for enhancing the growth of the plant are increased correspondingly.

It is to be appreciated that the resin-molded package of the invention is efficiently emitted out by ultraviolet light. It is thus preferable that the resin-molded package of the invention is used in combination with an excitation source such as a purple light-emitting diode element, because the blue or red light component is increased for further enhancement of the growth of the plant. Such configuration also allows light from an excitation source such as a purple light-emitting element to induce the lively motion of bees for an additional pollination.

Embodiment 3

In Embodiment 3, a plant with which the composition of the invention is used, an ornamental plant system and a method of growth of that plant will be explained in details.

FIG. 4 is illustrative of an ornamental plant system comprising a plant containing the phosphor of the invention.

An ornamental plant system 400 according to the invention comprises at least a plant 410 containing the phosphor of the invention and an excitation source 420 for exciting the phosphor in the plant 410. The plant 410 of the invention contains as the phosphor the one explained with reference to Embodiment 1 (the explanation thereof is left out).

The plant 410 of the invention is cultivated in the composition explained with reference to Embodiment 1. In the composition, the water-soluble solvent may be water or an organic solvent if it is capable of growing plants; however, water is preferable. The plant 410 of the invention contains the composition at least in the vessel tube, and further in the sieve tube.

Any desired excitation source may be used as the excitation source if it is able to excite the photoluminescent carbon nanoparticle in the composition contained in the plant 410; however, it is preferable to use a light source of emitting a light including deep ultraviolet rays, ultraviolet rays or visible light having a wavelength in a range of no less than 200 nm to no greater than 500 nm. More preferably, a light source of emitting an ultraviolet light of no less than 220 nm to no greater than 430 nm is used as the excitation source 420, and even more preferably, a light source of emitting an ultraviolet light of no less than 240 nm to no greater than 420 nm is used. For instance, an ultraviolet (or purple) light-emitting LED element of 330 to 420 nm is known for such excitation source 420. Light-emitting elements comprising nitride semiconductors such as AlN, GaN or InGaN may be employed as such an LED element.

The excitation source 420 may be connected to a controller such as a computer to program the operation of the excitation source 420.

According to the ornamental plant system 400 of the invention, the irradiation of the plant 410 with light from the excitation source 420 causes the photoluminescent carbon nanoparticle contained in the plant 410 to be excited, emitting a blue to red light. Thus, the ornamental plant system 400 of the invention is best suited for appreciation of the plant while it is allowed to emit light in the night. Further, if the operation of the excitation source 420 is programmed, the effect of appreciation could be much more enhanced.

The cultivation of the original plant in the composition explained with reference to at least Embodiment 1 is all that is needed for growth of such plant 410 according to the invention. Aquaculture is preferred because the incorporation of the composition into the plant is enhanced, and water is preferably used as the water-soluble solvent in the composition. Note here that the plant 410 may be cultivated either in the composition alone or in water containing the composition.

The present invention will now be explained with reference to specific examples; however, it is to be noted that the invention is in no sense limited thereto.

EXAMPLES

Example 1

In Example 1, a composition in which the photoluminescent carbon nanoparticle was dispersed in water acting as the water-soluble solvent was prepared by a hydrothermal synthesis method using an acid.

Hydrothermal synthesis of a solution dissolved in water of the organic material: citric acid (made by Wako Pure Chemical Corporation), the amine: ethylenediamine (EDA) (with a purity >99.5% and a specific gravity of D=0.899 g/mL, made by Sigma-Aldrich), and the inorganic acid: hydrochloric acid (with a purity of 35.0 to 37.0% and a specific gravity of D=1.179 g/mL, made by Wako Pure Chemical Corporation) was carried out (Step S110 of FIG. 1). Specifically, citric acid (1.5 grams) was dissolved in water (20 mL), the resultant solution was then transferred to a Teflon (registered trademark) vessel for autoclaving and hydrothermal synthesis, and ethylene-diamine (1.5 mL) and hydrochloric acid (0.25 mL) were then added to the solution. A Teflon (registered trademark) lid was put on the Teflon (registered trademark) vessel, which was then set in a stainless vessel and placed in a furnace. The conditions for hydrothermal synthesis were a heating temperature of 180° C. and a heating time of 4 hours. After 4 hours, heating was stopped followed by natural cooling.

Figures 5A, 5B:
FIGS. 5(A) and 5(B) show a light-emitting state of the composition of Example 1 (before the addition of ethanol).
Figure 6:
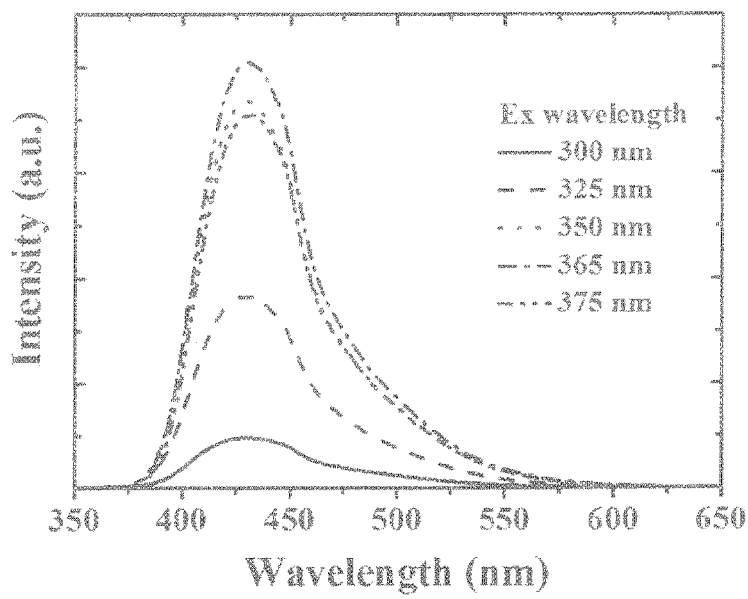
FIG. 6 shows the emission spectra of the composition according to Example 1 (before the addition of ethanol) by various excitation wavelengths.
Figure 7:
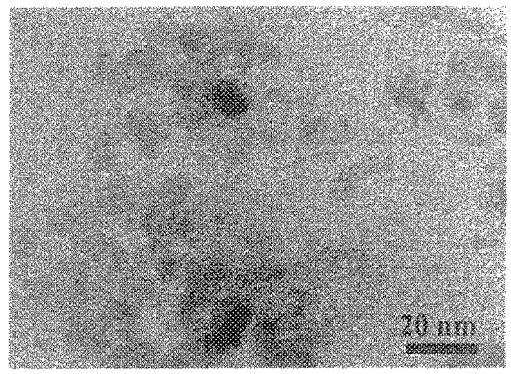
FIG. 7 shows a TEM image of the photoluminescent phosphor in the composition (before the addition of ethanol) according to Example 1.
Figure 8:
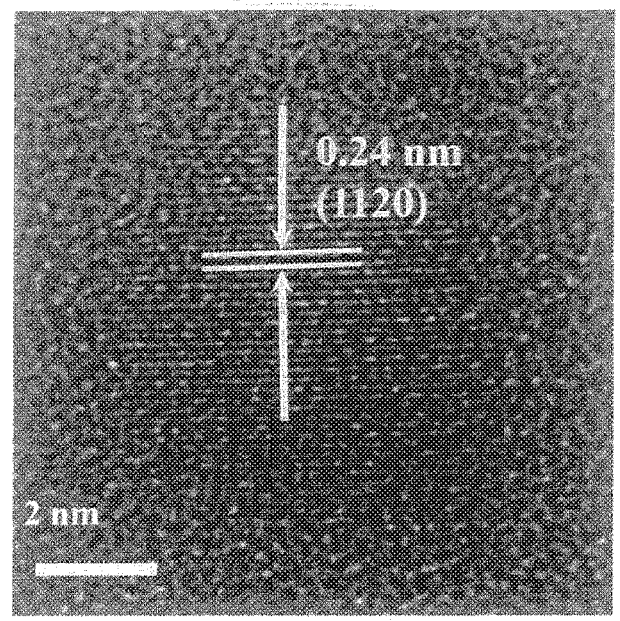
FIG. 8 shows an HR-TEM image of the photoluminescent phosphor in the composition (before the addition of ethanol) according to Example 1.

The obtained composition (solution) was diluted with water and transferred to a quartz cell to make a study of how light was emitted. The results are shown in FIG. 5. Then, the emission spectra of this composition were measured with the use of a fluorescence spectrophotometer (FP8500 made by JASCO). The results are shown in FIG. 6. The phosphor in the composition was observed under a high-resolution transmission electron microscope (HR-TEM) (JEM 2100F made by JEOL). TEM samples were prepared by a dispersion method. The results are shown in FIGS. 7 and 8.

Figure 9:
FIG. 9 shows a state of the composition (after the addition of ethanol) according to Example 1.
Figure 10:
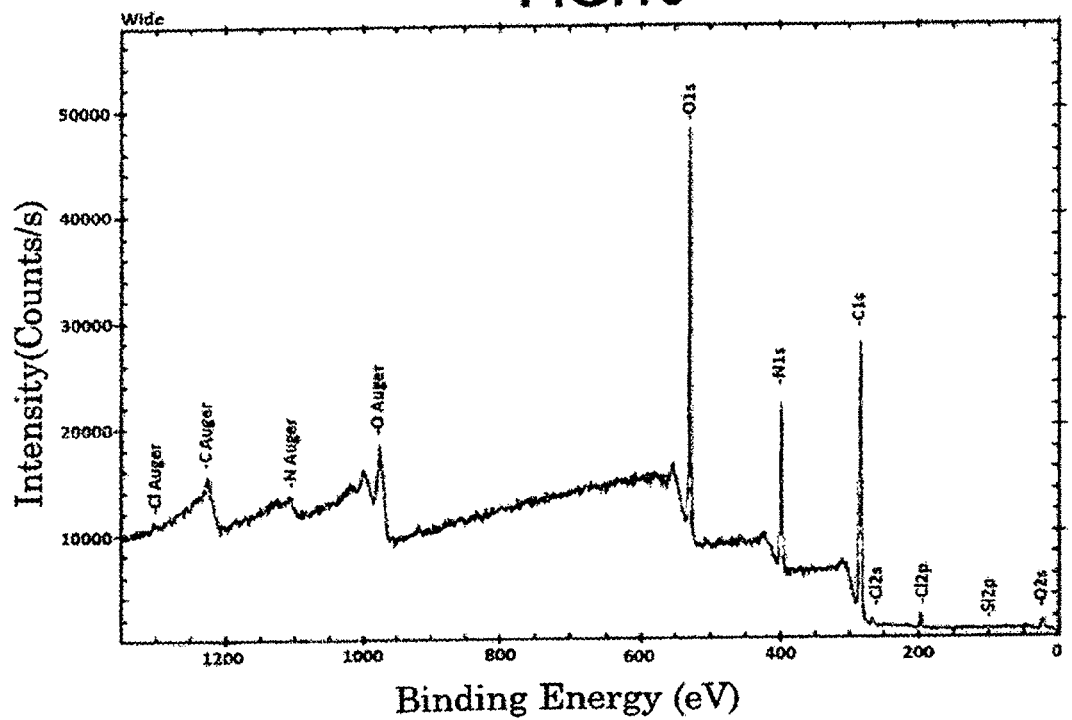
FIG. 10 shows the XPS spectra by wide scan of the photoluminescent phosphor in the composition (after the addition of ethanol) according to Example 1.
Figure 11:
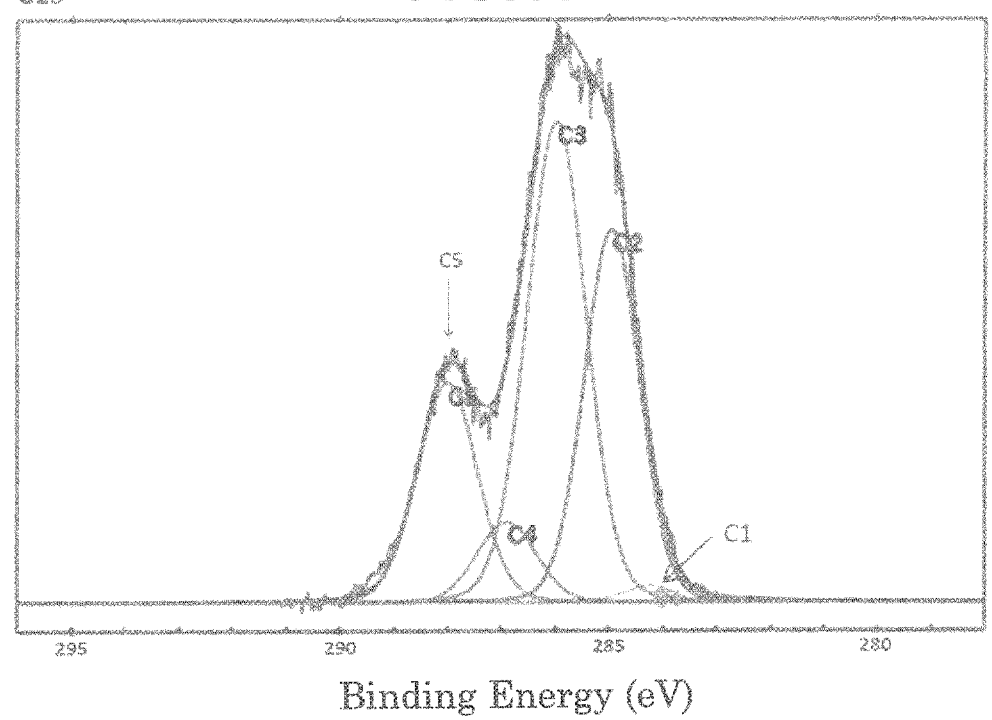
FIG. 11 shows the XPS spectra by C1s narrow scan of the photoluminescent phosphor in the composition (after the addition of ethanol) according to Example 1.
Figure 12:
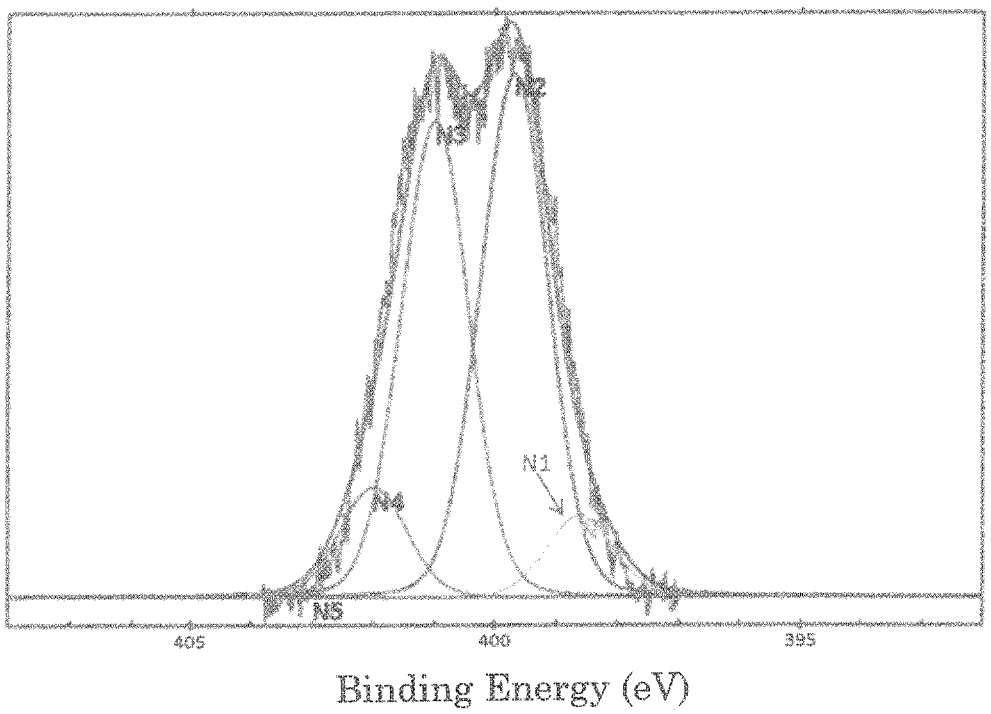
FIG. 12 shows the XPS spectra by N1s narrow scan of the photoluminescent phosphor in the composition (after the addition of ethanol according to Example 1.

Then, the alcohol: ethanol was added to, and stirred with, the obtained composition (solution) (Step S120 of FIG. 1). The amount of ethanol added was 400 v/v % relative to the solution. Addition and agitation of ethanol caused impurities to be separated from the solution into a supernatant and sediment. A state of the solution after the addition of ethanol is shown in FIG. 9. Then, the supernatant was extracted by separation of the sediment (Step S130 of FIG. 1). Chemical status analysis of the phosphor in the supernatant was carried out by an X-ray photoelectron spectrometer (XPS) (Quauterall made by PHI). The results are shown in FIGS. 10, 11 and 12.

Figure 13:
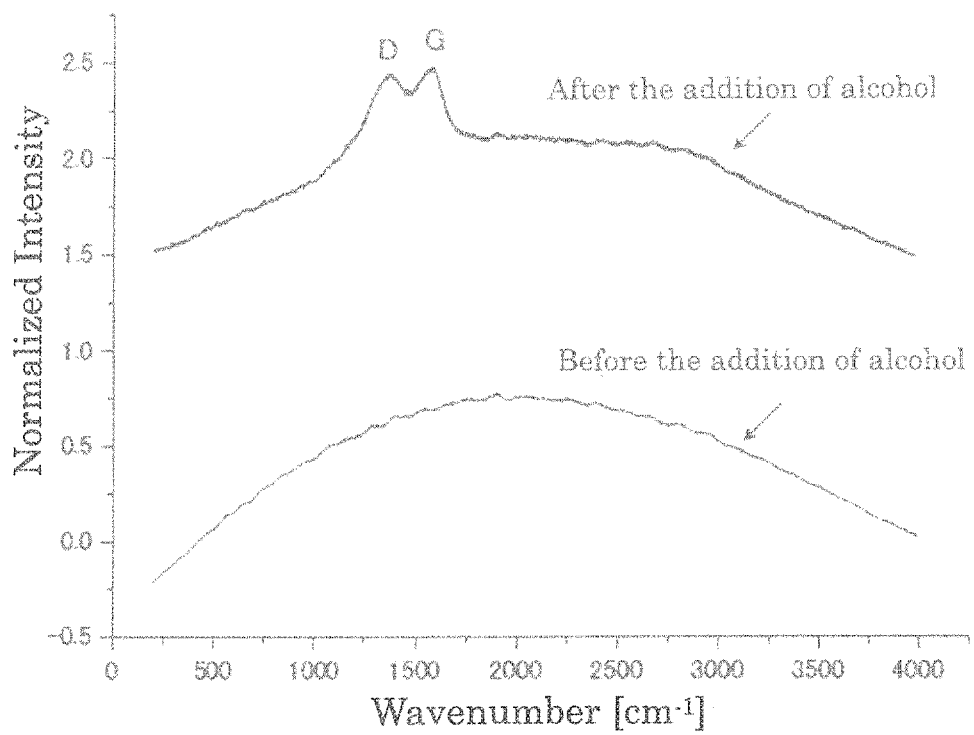
FIG. 13 shows the Raman spectra of the composition according to Example 1 before and after the addition of ethanol.
Figure 14:
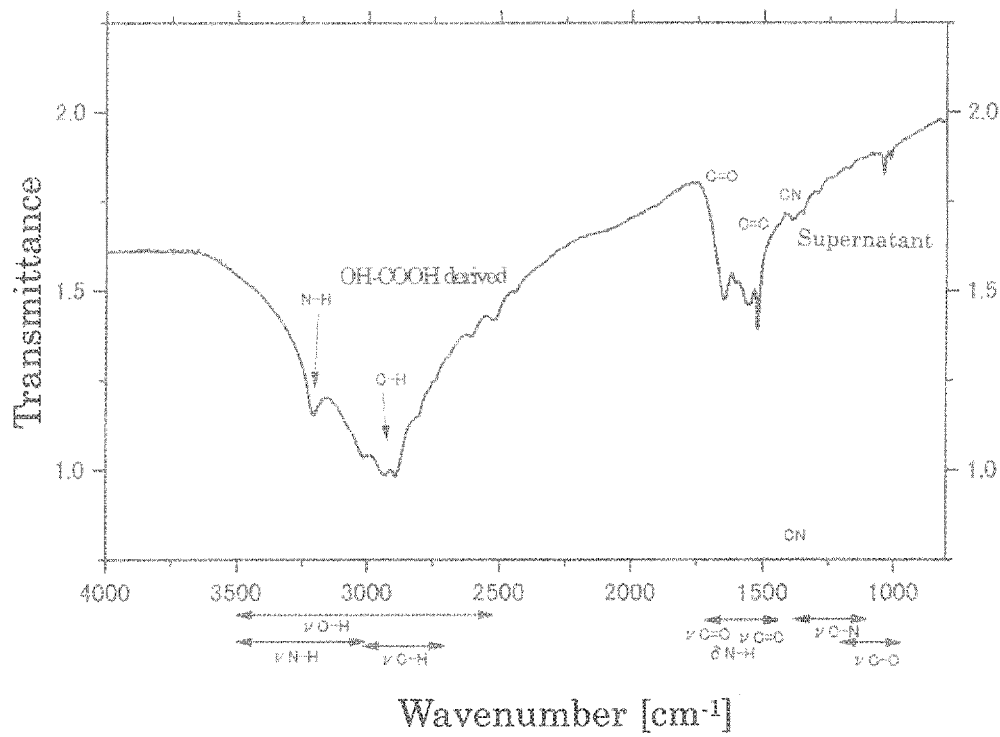
FIG. 14 shows the micro-FTIR spectra of the composition (after the addition of ethanol) according to Example 1.

The supernatant was dried to measure Raman spectra by means of a Raman spectrometer (Jabin-Yvon T64000 made by HORIBA). The results are shown in FIG. 13. Further, the infrared absorption spectra of the supernatant were measured using a Fourier transform infrared spectrophotometer (NICOLET is50 FT-IR made by Thermo). The results are shown in FIG. 14. In addition, the quantum efficiency was measured by a photoluminescence method using an absolute PL quantum yield spectrometer (C9920-02G made by Hamamatsu Photonics K.K.). Note here that unless otherwise noted, the measuring samples were diluted if necessary.

Example 2

In Example 2, a composition having a photoluminescent carbon nanoparticle dispersed in water behaving as the water-soluble solvent was prepared by hydrothermal synthesis using an acid; however, the process was substantially the same as that of Example 1 with the exception that an oven was used in place of the furnace and the heating temperature was set at 160° C., so it is not referred to anymore. With regard to the composition of Example 2 before the addition of ethanol, how light was emitted was observed, the emission spectra and XPS spectra were measured, and TEM observations were carried out. Also, with regard to the supernatant obtained by adding ethanol to the composition and separation of the sediment, the Raman spectra, FTIR spectra and quantum efficiency were measured.

Example 3

In Example 3, a composition having a photoluminescent carbon nanoparticle dispersed in water behaving as the water-soluble solvent was prepared by hydrothermal synthesis using an acid; however, the process was substantially the same as that of Example 2 with the exception that the heating temperature was 150° C., so it is not referred to anymore. With regard to the composition of Example 3 before the addition of ethanol, how light was emitted was observed, the emission spectra and XPS spectra were measured, and TEM observations were carried out. Also, with regard to the supernatant obtained by adding ethanol to the composition and separation of the sediment, the Raman spectra, FTIR spectra and quantum efficiency were measured.

Example 4

In Example 4, a composition having a photoluminescent carbon nanoparticle dispersed in water behaving as the water-soluble solvent was prepared by hydrothermal synthesis using an acid; however, the process was substantially the same as that of Example 1 with the exception that 2.0 grams of citric acid and 5.0 mL of ethylenediamine were used, a hot plate was used in place of the furnace and the heating temperature was set at 200° C., so it is not referred to anymore. With regard to the composition of Example 4 before the addition of ethanol, how light was emitted was observed, the emission spectra and XPS spectra were measured, and TEM observations were carried out. Also, with regard to the supernatant obtained by adding ethanol to the composition and separation of the sediment, the Raman spectra, FTIR spectra and quantum efficiency were measured.

Comparative Example 5

In Comparative Example 5, a composition having a photoluminescent carbon nanoparticle dispersed in water behaving as the water-soluble solvent was prepared by hydrothermal synthesis using neither an inorganic acid nor acetic acid. Specifically, the process was substantially the same as that of Example 1 with the exception that neither an inorganic acid nor acetic acid was used, a hot plate was used in place of the furnace, and the heating temperature was set at 250° C. With regard to the composition of Comparative Example 5 before the addition of ethanol, how light was emitted was studied, and the XPS spectra and quantum efficiency were measured.

Comparative Example 6

In Comparative Example 6, a composition having a photoluminescent carbon nanoparticle dispersed in water behaving as the water-soluble solvent was prepared by hydrothermal synthesis using neither an inorganic acid nor acetic acid; however, the process was substantially the same as that of Comparative Example 5 with the exception that 1.0 gram of citric acid, 0.05 mL of ethylenediamine and 30 mL of water were used and the heating temperature was set at 200° C., so it is not referred to anymore. With regard to the composition of Comparative Example 6 before the addition of ethanol, how light was emitted was studied, and the XPS spectra and quantum efficiency were measured.

Comparative Example 7

In Comparative Example 7, a composition having a photoluminescent carbon nanoparticle dispersed in water behaving as the water-soluble solvent was prepared by hydrothermal synthesis using neither an inorganic acid nor acetic acid; however, the process was substantially the same as that of Comparative Example 6 with the exception that 5.0 grams of citric acid and 0.1 mL of ethylenediamine were used, so it is not referred to anymore. With regard to the composition of Comparative Example 7 before the addition of ethanol, how light was emitted was studied, and the XPS spectra and quantum efficiency were measured.

Comparative Example 8

In Comparative Example 8, a composition having a photoluminescent carbon nanoparticle dispersed in water behaving as the water-soluble solvent was prepared by hydrothermal synthesis using neither an inorganic acid nor acetic acid; however, the process was substantially the same as that of Comparative Example 6 with the exception that the heating time was set at 1 hour, so it is not referred to anymore. With regard to the composition of Comparative Example 8 before the addition of ethanol, how light was emitted was studied, and the XPS spectra and quantum efficiency were measured.

As a matter of convenience, the experimental conditions for the aforesaid examples/comparative examples are set out in Table 1 to explain the results. Note here that in Table 1, the amounts of citric acid, ethylenediamine (EDA) and hydrochloric acid (HCl) are calculated relative to 100 grams of water.

TABLE 1

Listing of the experimental conditions for Examples/Comparative Examples 1 to 8

| Ex./Comp. | Citric Acid (g) | EDA (g) | Water (g) | HCl (g) |
|---|---|---|---|---|
| Example 1 | 7.5 | 6.75 | 100 | 1.25 |
| Example 2 | 7.5 | 6.75 | 100 | 1.25 |
| Example 3 | 7.5 | 6.75 | 100 | 1.25 |
| Example 4 | 10 | 22.25 | 100 | 1.25 |
| Comp. Ex. 5 | 7.5 | 6.75 | 100 | — |
| Comp. Ex. 6 | 5 | 0.225 | 100 | — |
| Comp. Ex. 7 | 25 | 0.45 | 100 | — |
| Comp. Ex. 8 | 5 | 0.225 | 100 | — |

| Ex./Comp. | Temperature (° C.) | Heating Time (h) |
|---|---|---|
| Example 1 | F180 | 4 |
| Example 2 | O160 | 4 |
| Example 3 | O150 | 4 |
| Example 4 | HP200 | 4 |
| Comp. Ex. 5 | HP250 | 4 |
| Comp. Ex. 6 | HP200 | 4 |
| Comp. Ex. 7 | HP200 | 4 |
| Comp. Ex. 8 | HP200 | 1 |

"F", "O" and "HP" stand for the furnace, oven and hot plate, respectively.

FIG. 5 shows the light-emitting state of the composition according to Example 1 (before the addition of ethanol).

A quartz cell containing the composition was placed on a black light (having a wavelength of 365 nm) to make a study of how light was emitted in the presence and absence of black light irradiation and in the presence and absence of putting an indoor light on. FIG. 5(A) is illustrative of how light was emitted out of the composition before the black light irradiation and at the time of putting the indoor light on. According to FIG. 5(A), it has been identified that the composition of Example 1 is transparent, and that before the black light irradiation and at the time of putting the indoor light on, there is no visible light emission detected. FIG. 5(B) is illustrative of how light is emitted out of the composition upon black light irradiation and at the time of putting the indoor light on. According to FIG. 5(B), it has been identified that the composition of Example 1 is efficiently excited by ultraviolet rays to emit a blue light. While a gray scale is given to FIG. 5, it is understood that a particularly bright portion of FIG. 5(B) is indicative of the blue-light emitting state. Although not illustrated, it has also been identified that the compositions of Examples 2, 3 and 4 are efficiently excited by ultraviolet rays to emit a blue light. Further, it has been identified that the compositions of Comparative Examples 5 to 8, too, are excited by ultraviolet rays to emit a blue light, but the lights emitted out of the compositions of Comparative Examples 5 to 8 are darker than those of Examples 1 to 4.

FIG. 6 is indicative of the emission spectra of the composition of Example 1 (before the addition of ethanol) by various excitation wavelengths.

According to FIG. 6, it has been identified that the composition of Example 1 is excited by various excitation wavelengths in the range of no less than 220 nm to no greater than 430 nm, and has an emission peak in the wavelength range of no less than 410 nm to no greater than 460 nm irrespective of any excitation wavelength, indicating that there is no excitation wavelength dependency. In particular, it has been found that the composition of Example 1 is efficiently excited by wavelengths in the range of no less than 350 nm to no greater than 375 nm. Although not illustrated, the emission spectra of the compositions according to Examples 2, 3 and 4 had also a similar tendency. In the emission spectra of the compositions of Comparative Examples 5 to 8, on the other hand, there were changes in the emission peak wavelength depending on the excitation wavelength.

FIG. 7 is a TEM image of the photoluminescent phosphor in the composition (before the addition of ethanol) according to Example 1.

According to FIG. 7, it has been found that the phosphor is a nanoparticle phosphor having a particulate shape having a diameter in the range of no less than 1 nm to no greater than 10 nm and an average particle diameter of 7 nm. Although not illustrated, it has also been identified that the phosphors in the compositions of Examples 2, 3 and 4 have a similar particle diameter.

FIG. 8 is an HR-TEM image of the photoluminescent phosphor in the composition (before the addition of ethanol) according to Example 1.

According to FIG. 8, it has been found that the phosphor has an interlayer distance of 0.24 nm that corresponds to the (1120) plane if the phosphor is mainly composed of carbon. Although not illustrated, the phosphors in the compositions of Examples 2, 3 and 4 had also a similar interlayer distance.

FIG. 9 is illustrative of what state the composition (after the addition of ethanol) according to Example 1 is in.

According to FIG. 9, it has been identified that there is brown sediment (area indicated by a dotted line) at the bottom of the vessel. From this, it has been shown that impurities settle down by the addition of ethanol in Step S120. Note here that the concentration of the photoluminescent carbon nanoparticle in the supernatant was 18 g/L as converted into the solution before the addition of ethanol.

FIG. 10 shows the XPS spectra by wide scan of the photoluminescent phosphor in the composition (after the addition of ethanol) according to Example 1.

FIG. 11 shows the XPS spectra by C1s narrow scan of the photoluminescent phosphor in the composition (after the addition of ethanol) according to Example 1.

FIG. 12 shows the XPS spectra by N1s narrow scan of the photoluminescent phosphor in the composition (after the addition of ethanol) according to Example 1.

According to FIG. 10, it has been found that the peak C1s is in the vicinity of 283 eV, the peak N1s is in the vicinity of 398 eV, and the peak O1s is in the vicinity of 530 eV, indicating that the photoluminescent phosphor in the composition has at least a carbon atom, an oxygen atom and a nitrogen atom. By calculation based on the peak ratio, the atomic ratio (N/C) of the nitrogen atom relative to the carbon atom and the atomic ratio (O/C) of the oxygen atom relative to the carbon atom were found to be 0.32 and 0.40, respectively.

According to FIG. 11, it has further been observed that a C=C bond-derived peak (corresponding to C1 in the figure) is at 284.2 eV, a C—C bond and/or C—H bond-derived peak (corresponding to C2 in the figure) is at 284.95 eV, a C—N bond and/or C—O bond-derived peak (corresponding to C3 in the figure) is at 285.98 eV, a C=N bond and/or C=O bond-derived peak (corresponding to C4 in the figure) is at 286.90 eV, and a N—C=O bond and/or O—C=O bond-derived peak (corresponding to C5 in the figure) is at 288.00 eV.

It has here been found that, in the XPS spectra, the intensity of the C—N bond and/or C—O bond-derived peak is greater than the intensity of the C—C bond and/or C—H bond-derived peak. Although not illustrated, the XPS spectra of the photoluminescent phosphors in the compositions of Examples 2, 3 and 4 had also a similar tendency. In the XPS spectra of the photoluminescent phosphors in the compositions of Comparative Examples 5 to 8, on the other hand, the intensity of the C—N bond and/or C—O bond-derived peak was less than the intensity of the C—C bond and/or C—H bond-derived peak.

According to FIG. 12, it has further been observed that an outstanding peak (corresponding to N1 in the figure) derived from a pyridine-like nitrogen atom is at 398.60 eV, a peak (corresponding to N2 in the figure) derived from the nitrogen atom of the amine is at 399.70 eV, a peak (corresponding to N3 in the figure) derived from a pyrrole-like nitrogen atom is at 401.00 eV, a peak (corresponding to N4 in the figure) derived from a quaternary ammonium cation and/or a graphite-like nitrogen atom is at 402.00 eV, and a peak (corresponding to N5 in the figure) derived from the N—O bond is at 403.00 eV.

FIG. 13 shows the Raman spectra of the composition according to Example 1 before and after the addition of ethanol.

From FIG. 13, it has been revealed that the addition of ethanol allows the Raman spectra of the photoluminescent phosphor to have an energy peak close to the graphene-like G-band and D-band. From this, it has been identified that the impurities could be removed by the addition of ethanol for high-purity extraction of the photoluminescent carbon nanoparticle. Although not illustrated, it has also been identified that there are the peaks based on the G-band and D-band in the compositions of Examples 2, 3 and 4.

FIG. 14 shows the micro-FTIR spectra of the composition (after the addition of ethanol) according to Example 1.

According to FIG. 14, it has been found that the photoluminescent phosphor in the composition according to Example 1 includes the hydrogen atom in addition to the carbon atom, oxygen atom and nitrogen atom, and has an N—H bond (near 3210 cm$^{-1}$), a C=O bond (near 1650 cm$^{-1}$), a C=C bond (near 1530 cm$^{-1}$), a C—H bond (near 2890 to 2490 cm$^{-1}$), and a C—N bond (near 1350 cm$^{-1}$).

Although not illustrated, it has also been found that the compositions of Examples 2, 3 and 4 have similar FTIR spectra.

Further, it has been identified that the compositions of Examples 1 to 4 extracted after the addition of ethanol have a high quantum efficiency of 80% or higher. On the other hand, the quantum efficiency of the compositions of Comparative Examples 5 to 8 before the addition of ethanol remained as low as about 60%.

From the foregoing, it has been identified that the compositions according to Examples 1 to 4 each have a photoluminescent carbon nanoparticle dispersed therein, which nanoparticle contains a carbon atom, an oxygen atom, a nitrogen atom and a hydrogen atom, and in which nanoparticle the intensity of a peak derived from a C—N bond and/or a C—O bond in terms of the XPS spectra is greater than that of a peak derived from a C—C bond and/or a C—H bond with peaks based on the G-band and D-band in terms of the Raman spectra; so it has an emission peak in a constant wavelength range of 410 nm to 460 nm irrespective of excitation wavelengths, and is enhanced in terms of quantum efficiency.

Example 9

Prepared in Example 9 was a composition having a photoluminescent carbon nanoparticle dispersed in water and poly-vinyl alcohol (PVA: made by Wako Pure Chemical Corporation) each acting as a water-soluble solvent.

PVA powders (2 grams) added to deionized water (60 mL) were held at 90° C. for 3 hours to prepare an aqueous PVA solution (in a PVA concentration of 3.3 wt %). The composition obtained in Example 1 and after ethanol was added to it (a composition having a photoluminescent carbon nanoparticle dispersed in water as the water-soluble solvent (in a photoluminescent carbon nanoparticle concentration of 18 g/L as calculated on the basis of the solution before the addition of ethanol)) was added to, and stirred with, an aqueous PVA solution (4 mL) to prepare compositions in various concentrations. The sample numbers for the obtained compositions, the amounts of the composition added according to Example 1 and the concentration of the photoluminescent carbon nanoparticle in each sample are tabulated in Table 2.

TABLE 2

Listing of the conditions for the composition of Example 9

| Sample No. | Amount of the composition of Ex. 1 added (µL) | Concentration of PVA (wt %) | Concentration of the photoluminescent phosphor in an aqueous PVA solution (g/L) |
| --- | --- | --- | --- |
| 9-1 | 0.025 | 3.3 | $1 \times 10^{-4}$ |
| 9-2 | 0.05 | 3.3 | $2 \times 10^{-4}$ |
| 9-3 | 0.125 | 3.3 | $6 \times 10^{-4}$ |
| 9-4 | 0.5 | 3.3 | $2 \times 10^{-3}$ |
| 9-5 | 1.25 | 3.3 | $6 \times 10^{-3}$ |
| 9-6 | 2.5 | 3.3 | $1 \times 10^{-2}$ |
| 9-7 | 5.0 | 3.3 | $2 \times 10^{-2}$ |
| 9-8 | 7.5 | 3.3 | $3 \times 10^{-2}$ |
| 9-9 | 10.0 | 3.3 | $5 \times 10^{-2}$ |
| 9-10 | 12.5 | 3.3 | $6 \times 10^{-2}$ |
| 9-11 | 17.0 | 3.3 | $8 \times 10^{-2}$ |
| 9-12 | 25.0 | 3.3 | $1 \times 10^{-1}$ |
| 9-13 | 50.0 | 3.3 | $2 \times 10^{-1}$ |

Figure 16:
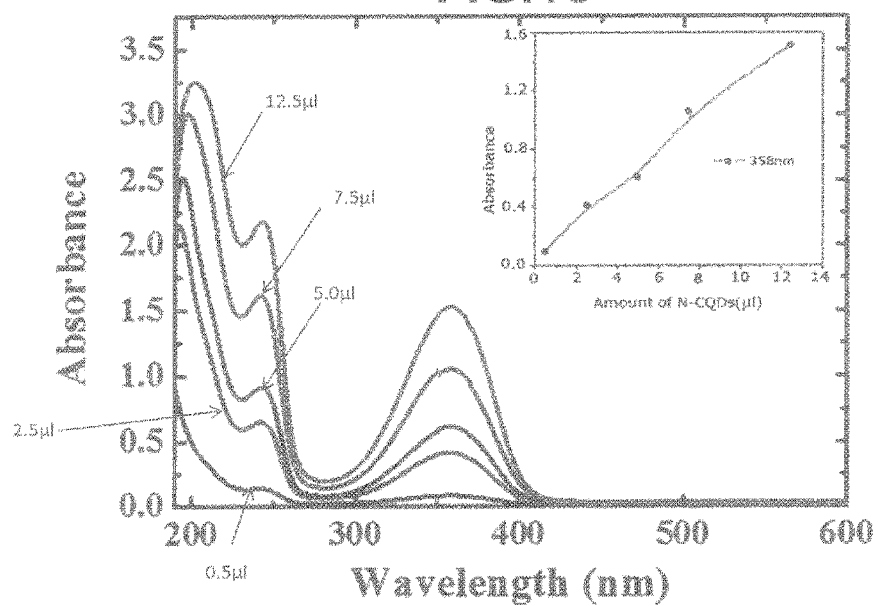
FIG. 16 shows the absorption spectra of the composition according to Example 9.
Figure 17:
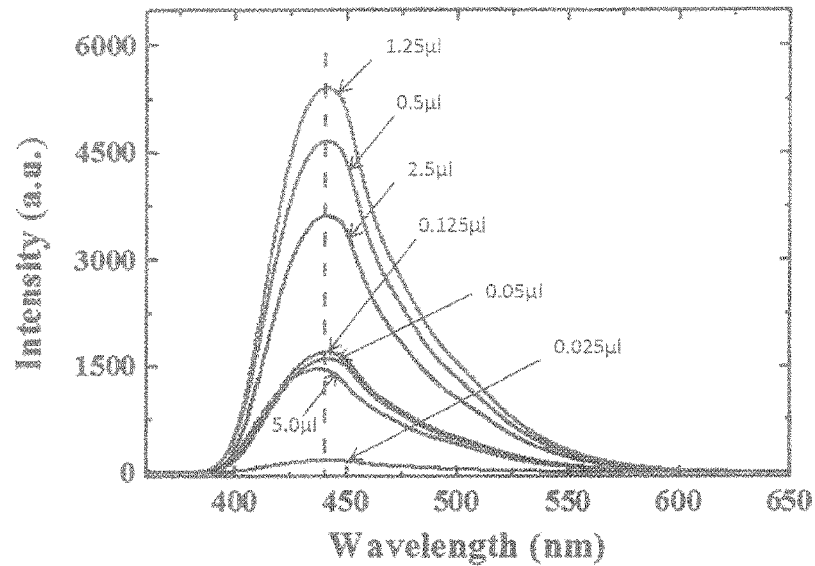
FIG. 17 shows the emission spectra of the composition according to Example 9.
Figure 18:
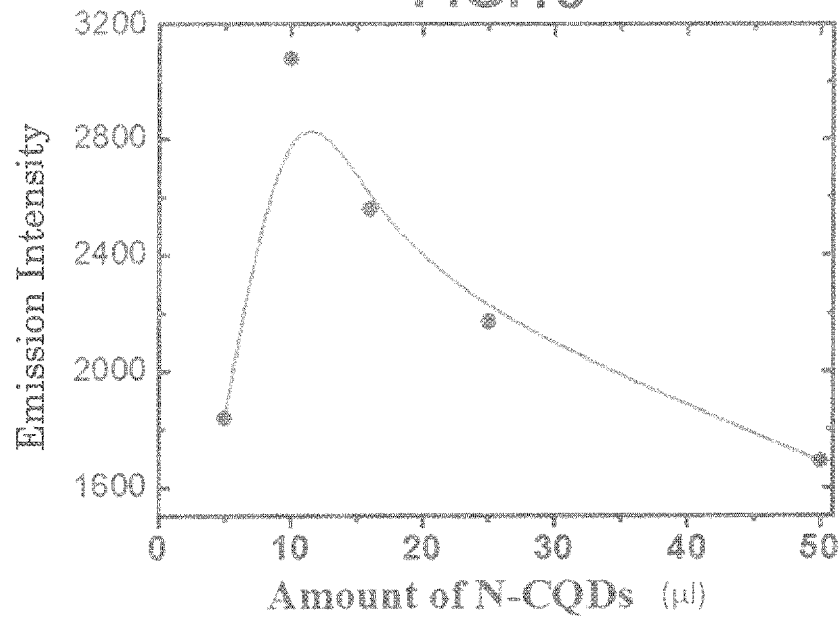
FIG. 18 shows the dependency of the emission intensity of the composition according to Example 9 on the concentration of the photoluminescent carbon nanoparticle.
Figure 19:
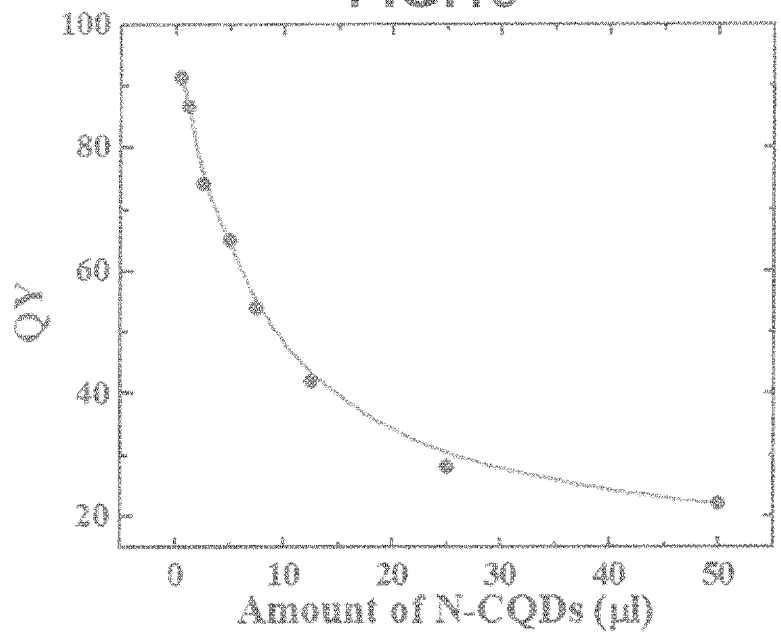
FIG. 19 shows the dependency of the quantum efficiency of the composition according to Example 9 on the concentration of the photoluminescent carbon nanoparticle.

The light-emitting state of the resulting compositions (Sample Nos. 9-1 to 9-13) were studied. The results are shown in FIG. 15. Of the compositions, the absorption spectra and emission spectra were measured. The results are shown in FIGS. 16, 17 and 18. The quantum efficiency was also measured by the photoluminescence method. The results are shown in FIG. 19.

FIG. 15 is illustrative of the light-emitting state of the composition of Example 9.

Figures 15A, 15B:
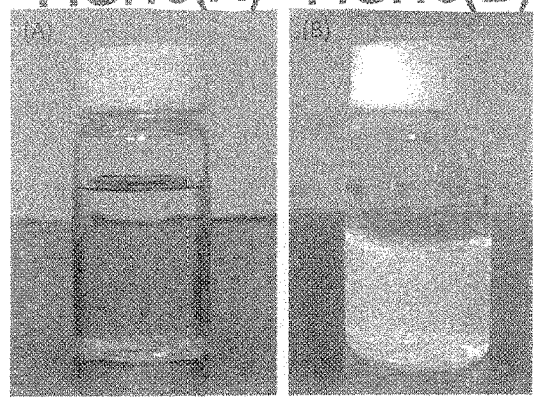
FIGS. 15(A) and 15(B) show a light-emitting state of the composition according to Example 9.

FIG. 15(A) is illustrative of the light-emitting state of the composition of Example 9 (Sample No. 9-7) before black light (365-nm wavelength) irradiation; it has been identified that the composition is in a transparent liquid state. FIG. 15(B) is illustrative of the light-emitting state of the composition of Example 9 (Sample No. 9-7) upon black light irradiation; it has been found that it emits a blue light by black light irradiation. In FIG. 15 shown on a gray scale, the blue light-emitting state is indicated by a brighter portion. Although not shown, it has also been identified that other samples are excited by ultraviolet rays to emit a blue light.

FIG. 16 shows the absorption spectra of the composition according to Example 9.

FIG. 16 shows the absorption spectra of Sample Nos. 9-4, 9-6, 9-7, 9-8 and 9-10 for the composition of Example 9. It has been identified that the composition of Example 9 efficiently absorbs ultraviolet light but absorb no or little visible light. As a result of a study of the relationship between the concentration and the absorbance at 365 nm wavelength of the photoluminescent carbon nanoparticle in the composition (inserted in the upper right of FIG. 16), it has been found that the absorbance increases with an increasing concentration of the photoluminescent carbon nanoparticle in the composition.

FIG. 17 is illustrative of the emission spectra of the composition according to Example 9.

FIG. 17 shows the emission spectra of Sample Nos. 9-1 to 9-7 for the composition of Example 9 upon excited at an excitation wavelength of 365 nm. According to FIG. 17, it has been found that all the samples have a peak in the wavelength range of no less than 410 nm to no greater than 460 nm, and the emission wavelength is not dependent on the concentration of the photoluminescent carbon nanoparticle contained. Although not shown, it has also been found that similar results are obtained for other samples.

FIG. 18 shows the dependency of the emission intensity of the composition according to Example 9 on the concentration of the photoluminescent carbon nanoparticle.

FIG. 18 shows the emission intensities of the emission peak wavelength (440 nm) of Sample Nos. 9-7, 9-9, 9-11, 9-12 and 9-13 for the composition according to Example 9. In the composition according to Example 9, it has been found that until the concentration of the photoluminescent carbon nanoparticle contained in the composition reaches a certain threshold value, the emission intensity increases with an increasing concentration, but it decreases when the concentration exceeds the threshold value. One possible reason has been that as the concentration of the photoluminescent carbon nanoparticle exceeds the threshold value, it causes the distance between the photoluminescent carbon nanoparticles to become short and particle interactions such as concentration quenching to get increased, resulting in emission intensity drops.

FIG. 19 shows the relationship between the concentration of the photoluminescent carbon nanoparticle and the quantum efficiency in the composition according to Example 9.

FIG. 19 shows the quantum efficiencies of Sample Nos. 9-3, 9-4, 9-6, 9-7, 9-8, 9-10, 9-12 and 9-13 for the composition of Example 9. It has been expected that there is such a similar tendency as shown in FIG. 18 found for quantum efficiency; according to FIG. 19, however, it has surprisingly be found that the quantum efficiency grows high with a decrease in the concentration of the photoluminescent carbon nanoparticle contained.

It has been found from FIGS. 18 and 19 that if the concentration of the photoluminescent carbon nanoparticle in the composition satisfies the range of no less than $3\times10^{-2}$ g to no greater than $1\times10^{-1}$ g, it is then possible to provide a composition having a high emission intensity and a high quantum efficiency.

Example 10

In Example 10, a resin-molded package was prepared with a photoluminescent carbon nanoparticle dispersed in polyvinyl alcohol (PVA) for the water-soluble polymer resin. Specifically, 0.5 mL of the composition of Example 9 was drop-casted on a quartz substrate, and then dried at 90° C. for 1 hour to obtain a resin-molded package. Summarized in Table 3 are Sample Numbers for the obtained resin-molded package, the type of the composition of Example 9 used, and the content of the photoluminescent carbon nanoparticle in the resin-molded package.

TABLE 3

Listing of the conditions for the resin-molded package of Example 10

| Sample No. | Type of the composition used | Content of the photoluminescent phosphor in PVA (wt %) |
|---|---|---|
| 10-1 | Sample 9-7 | 0.07 |
| 10-2 | Sample 9-13 | 0.7 |

The light-emitting state of the obtained resin-molded package (Sample 10-1 and 10-2) was studied. The results are shown in FIG. 20. The resin-molded package was peeled out of the quartz substrate to obtain the resin-molded package in the form of a self-supporting film. The emission spectra of the resin-molded package in the form of a self-supporting film were measured to make a study of a quantum efficiency change with the elapse of time. The results are shown in FIG. 21.

FIG. 20 shows the light-emitting state of the resin-molded package according to 10 (Sample Nos. 10-1 and 10-2).

Figures 20A, 20B:
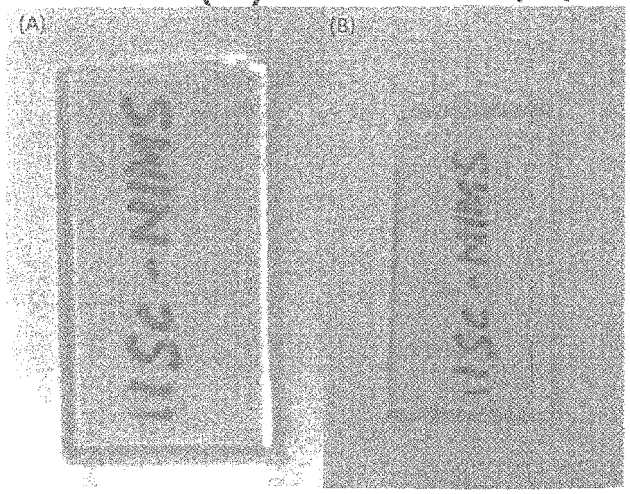
FIGS. 20(A), 20(B), 20(C) and 20(D) show the light-emitting state of the resin-molded package (Sample Nos. 10-1 and 10-2) according to Example 10.
Figures 20C, 20D:
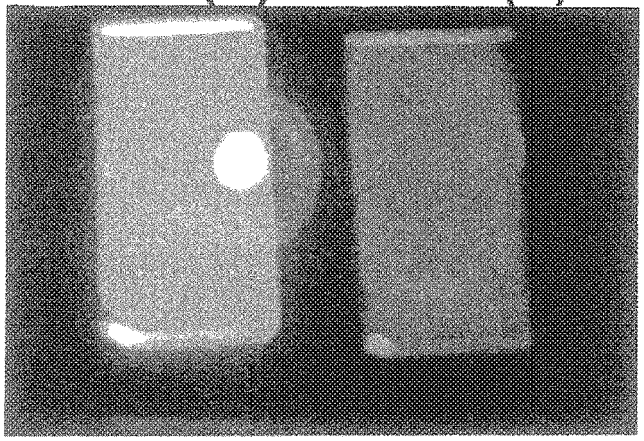

FIGS. 20(A) and 20(B) are respectively illustrative of the light-emitting states of Sample Nos. 10-1 and 10-2 before black light irradiation (365 nm wavelength), indicating that both the samples are in a transparent film state. FIGS. 20(C) and 20(D) are respectively illustrative of the light-emitting states of Sample Nos. 10-1 and 10-2 upon black light irradiation, indicating that both the samples emit a blue light by black light irradiation. In FIG. 20 shown on a gray scale, the blue light-emitting state is indicated by a brighter portion. According to FIGS. 20(C) and 20(D), it has been found that Sample No. 10-1 emits a brighter light than Sample No. 10-2 does. This is well consistent with the results of Example 9, suggesting that if the concentration of the photoluminescent carbon nanoparticle in the resin-molded package satisfies the range of no less than $1\times10^{-2}$ wt % to less than 0.7 wt %, it is then possible to provide a resin-molded package having a high emission intensity and a high quantum efficiency.

Figure 21:
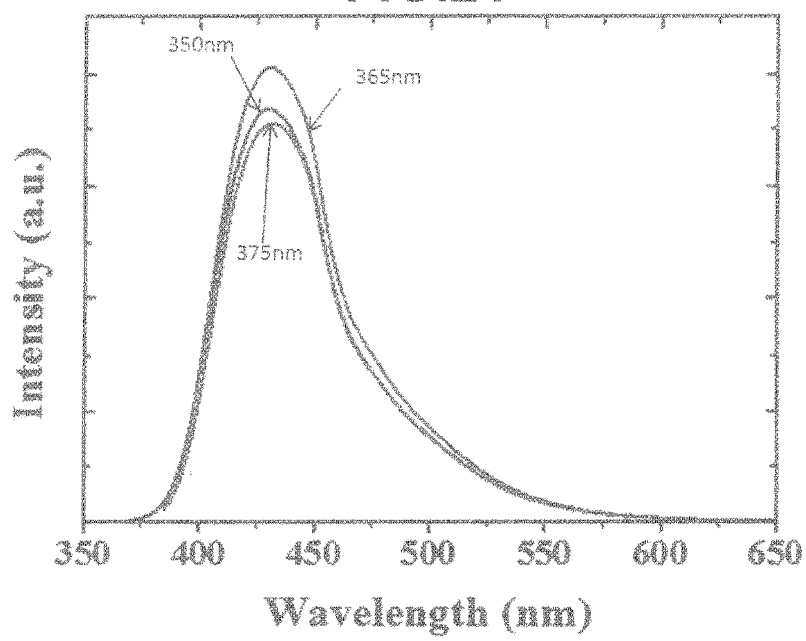
FIG. 21 shows the emission spectra of the resin-molded package (Sample 10-1) according to Example 10 by various excitation wavelengths.

FIG. 21 shows the emission spectra of the resin-molded package according to Example 10 (Sample No. 10-1) by various excitation wavelengths.

According to FIG. 21, it has been identified that Sample No. 10-1 of Example 10 is excited by various excitation wavelengths of no less than 220 nm to no greater than 430 nm in general and efficiently excited by various excitation wavelengths of no less than 350 nm to no greater than 375 nm in particular, with emission peaks in the wavelength range of no less than 410 nm to no greater than 460 nm and with the emission peak wavelength not dependent on excitation wavelengths. Although not shown, the emission spectra of Sample No. 10-2 according to Example 10 is also found to have a similar tendency. From a comparison of FIG. 17 with FIG. 21, it has been shown that the emission peak wavelength of the resin-molded package is substantially identical with the emission peak wavelength of the composition used for the starting material, and that there is no change in emission characteristics by fixing the photoluminescent carbon nanoparticle fixed in the resin.

As a result of a study of a quantum efficiency change with the elapse of time, it has further been found that a quantum efficiency of as high as 80% or more is maintained even after the elapse of 20 hours.

From the foregoing, it has been shown that by using the composition of the invention to fix the photoluminescent carbon nanoparticle in the resin, it is possible to provide a resin-molded package improved in terms of durability and enhanced in terms of emission intensity and quantum efficiency.

Example 11

In Example 11, the composition obtained in Example 9-7 with the photoluminescent carbon nanoparticle dispersed in it was applied to an ink material. The composition obtained in Example 9-7 was painted and printed on a bill. The light-emitting state of the bill upon ultraviolet light irradiation (365-nm wavelength) was observed. The results of observation are shown in FIG. 22.

Figure 22:
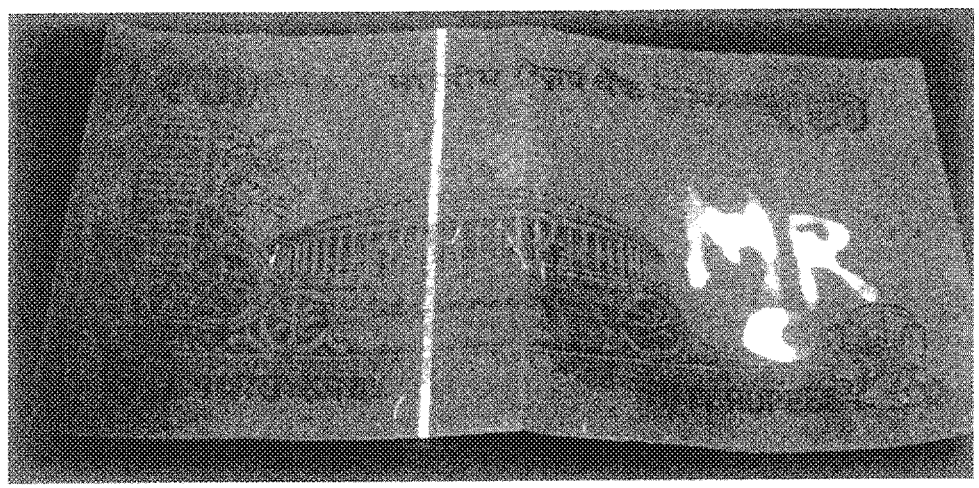
FIG. 22 shows the light-emitting state of a bill painted with the ink material according to Example 11.

FIG. 22 shows the light-emitting state of the bill painted with the ink material according to Example 11.

According to FIG. 22, it has been identified that as the bill is irradiated with ultraviolet light, it causes only the area printed with the ink material to be brightly indicated. From this, it has been shown that the composition of the invention can be used as the ink material; it can advantageously be used as a secret ink for authenticity judgment by ultraviolet light and preparation of secret papers.

Example 12

In Example 12, the composition of Example 1 to which ethanol was not yet added (i.e., only water was used as the water-soluble solvent) was used to grow bean sprouts as the plant.

One hundred (100) mL of the composition of Example 1 were placed in a beaker together with about 20 bean seeds, and the beaker was covered with an aluminum foil for the purpose of blocking off light. Then, the beaker was held at room temperature for 120 hours to 168 hours while the composition was replaced for each 12 hours. After the passage of 120 hours to 168 hours, the bean sprouts were removed and washed with water, after which they were irradiated with ultraviolet light (365-nm wavelength) for observation of the light-emitting state. The results of observation are shown in FIG. 23.

FIG. 23 shows the light-emitting state of buds of the plants (bean sprouts) according to Example 12.

Figure 23A:
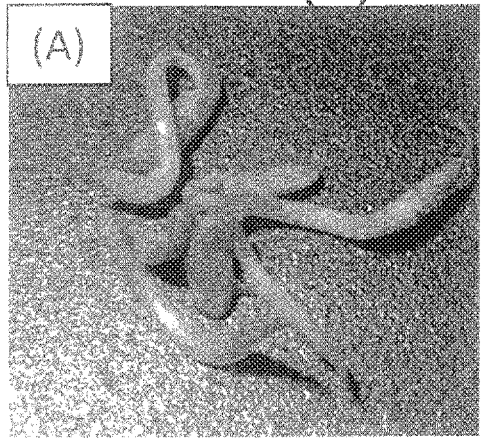
FIGS. 23(A) and 23(B) show the light-emitting state the bud of a plant (bean sprouts) according to Example 12.
Figure 23B:
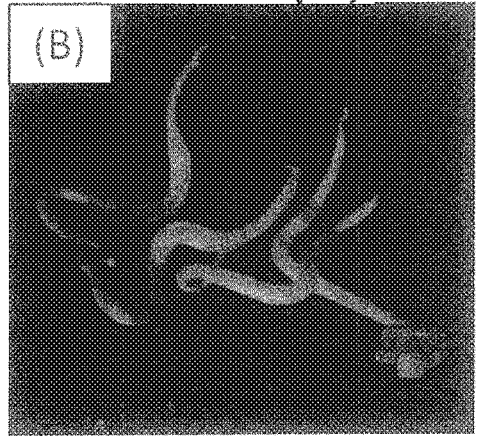

FIGS. 23(A) and 23(B) show the light-emitting state of the sprouts before and upon ultraviolet light irradiation, respectively. According to FIG. 23(B), it has been found that the sprouts emit a blue light upon ultraviolet irradiation. Note here that in FIG. 23(B) given on a gray scale, the blue light-emitting state is indicated by white portions. It has been identified that the composition of the invention is contained within the sprouts. While FIG. 23 shows the light-emitting state of the sprouts after 168-hour (7-day) cultivation, it has been understood that similar light emissions take place even after 120-hour (5-day) cultivation.

From this it has been shown that the plant cultivated in the composition of the invention contains the composition of the invention therein, and emits a blue light by ultraviolet light, and that if ultraviolet light is used in combination with the plant grown with the use of the composition of the invention, it is then possible to create an ornamental plant system.

INDUSTRIAL APPLICABILITY

The composition of the invention may be used as ink materials and light-emitting or coloration materials for vinyl or the like, because it contains a photoluminescent carbon nanoparticle thereby having high emission intensity and high quantum efficiency with the emission wavelength not dependent on excitation wavelengths. If a plant is grown with the use of the composition of the invention, the plant will contain the composition of the invention, offering advantages to ornamental purposes or acceleration of photosynthesis making use of a blue or red light. If the composition according to the invention is incorporated not only in a growing plant but also in cells such as stem cells during incubation, it may possibly be used as a label or marker for observation of the cells under a fluorescence microscope. Further, if the composition according to the invention is carried on resins, oils and fats or the like, it may be used as an ultraviolet ray cutting material. The composition according to the invention, because of absorbing ultraviolet rays to emit a blue light, may be covered, coated or otherwise applied on foodstuffs, living bodies, papers or the like to prevent them from degradation by ultraviolet ray irradiation. The resin-molded package according to the invention, because the photoluminescent carbon nanoparticle is fixed by resin, is used for light-emitting devices, solar battery modules or the like for the reasons that it is enhanced in terms of durability, emission intensity and quantum efficiency, and is capable of absorbing ultraviolet light efficiently to convert it into a blue light. Furthermore, the production process of the invention is capable of producing the aforesaid composition according to the invention with efficiencies and high purities, so it is of great advantage to practicality.

EXPLANATION OF THE REFERENCE NUMERALS

200: Light-Emitting Device
210, 220: Lead Wire
230: Alumina Substrate
240: Purple Light-Emitting Diode Element
250: Fine Gold Wire
260: Resin-Molded Package
270: Resin
280: Wall Face Member
300: Solar Battery Module
310: Solar Battery Cell
320: Transparent Sealing Film 330: Back Sheet
340: Surface Protection Film
400: Ornamental Plant System
410: Plant that contains the photoluminescent phosphor of the invention
420: Excitation Source

What is claimed is:

1. A composition having a photoluminescent carbon nanoparticle dispersed in a water-soluble solvent, wherein:
   the photoluminescent carbon nanoparticle contains a carbon atom, an oxygen atom, a nitrogen atom, and a hydrogen atom if required,
   the photoluminescent carbon nanoparticle has an intensity of a C—N bond and/or C—O bond-derived peak (285.98 eV) larger than that of a C—C bond and/or C—H bond-derived peak (284.95 eV) in terms of X-ray photoelectron spectroscopic spectra, and
   the photoluminescent carbon nanoparticle exhibits a Raman spectrum having a peak based on a G-band and a D-band.

2. The composition according to claim 1, wherein the photoluminescent carbon nanoparticle further has an N—H bond, a C=C bond, and a C≡C bond.

3. The composition according to claim 1, wherein:
   in the photoluminescent carbon nanoparticle, an atomic ratio (N/C) of the nitrogen atom relative to the carbon atom is no less than 0.27 to no greater than 0.37, and
   an atomic ratio (O/C) of the oxygen atom relative to the carbon atom is no less than 0.35 to no greater than 0.45.

4. The composition according to claim 1, wherein the photoluminescent carbon nanoparticle has a concentration in a range of no less than $1\times10^{-4}$ g/L to no greater than 300 g/L.

5. The composition according to claim 1, wherein the water-soluble solvent is water and/or a water-soluble organic solvent.

6. The composition according to claim 5, wherein the water-soluble solvent further contains a water-soluble polymer.

7. The composition according to claim 6, wherein the water-soluble polymer is selected from the group consisting of polyvinyl alcohol, sodium polyacrylate, polyacrylamide, polyethylene-imine, polyethylene oxide, polyvinyl pyrrolidone, and carboxylvinyl polymer.

8. The composition according to claim 1, which has an emission peak in a wavelength range of no less than 400 nm to no greater than 700 nm by excitation source irradiation.

9. A process of producing the composition of claim 1 having a photoluminescent carbon nanoparticle dispersed in a water-soluble solvent, which includes:
   a step of hydrothermal synthesis of a solution in which an organic material selected from the group consisting of citric acid, benzoic acid, glucose, fructose and sucrose, an amine, and at least one selected from an inorganic acid and acetic acid are dissolved in a water-soluble solvent,
   a step of adding an alcohol to a solution obtained by the hydrothermal synthesis step and stirring the solution, and
   a step of extracting a supernatant from a solution obtained by the adding/stirring step.

10. A resin-molded package having a photoluminescent carbon nanoparticle dispersed in a resin, wherein:
    the photoluminescent carbon nanoparticle contains a carbon atom, an oxygen atom, a nitrogen atom, and a hydrogen atom if required, and has an intensity of a C—N bond and/or C—O bond-derived peak (285.98 eV) larger than that of a C—C bond and/or C—H bond-derived peak (284.95 eV) in terms of X-ray photoelectron spectroscopic spectra and has a Raman spectrum having a peak based on a G-band and a D-band, and
    the resin is a water-soluble polymer through which light having wavelengths from the ultraviolet region to the visible region transmits.

11. The resin-molded package according to claim 10, wherein a content of the photoluminescent carbon nanoparticle in the water-soluble polymer is in a range of no less than $1\times10^{-4}$ wt % to no greater than 10 wt %.

12. The resin-molded package according to claim 10, wherein the water-soluble polymer is selected from the group consisting of polyvinyl alcohol, sodium polyacrylate, polyacrylamide, polyethylene-imine, polyethylene oxide, polyvinyl pyrrolidone, and carboxylvinyl polymer.

13. An ink material containing a photoluminescent phosphor, which comprises the composition according to claim 1.

14. A light-emitting device including at least an excitation source and a phosphor, wherein the phosphor comprises the resin-molded package according to claim 10.

15. A solar battery module including at least a solar battery cell and a transparent sealing film positioned on a light-receiving surface of the solar battery cell, wherein the transparent sealing film comprises the resin-molded package according to claim 10.

16. A plant containing a photoluminescent phosphor, wherein the plant contains the composition according to claim 1.

17. An ornamental plant system, which comprises a plant containing a photoluminescent phosphor and an excitation source configured to excite the phosphor, wherein the plant is the plant according to claim 16.

18. A method of growing the plant of claim 16 containing a photoluminescent phosphor, which includes a step of cultivating a plant in the composition.

19. An ultraviolet ray-cutting material, which contains the composition according to claim 1.

20. Sun block cosmetics or ointments, which contains the composition according to claim 1.

* * * * *